(12) United States Patent
Honda et al.

(10) Patent No.: US 8,508,297 B2
(45) Date of Patent: Aug. 13, 2013

(54) ENVELOPE AMPLIFIER

(75) Inventors: Yuri Honda, Kanagawa (JP); Yuji Takahashi, Tokyo (JP)

(73) Assignees: Renesas Electronics Corporation, Kawasaki-shi, Kanagawa (JP); NEC Corporation, Tokyo (JP)

( * ) Notice: Subject to any disclaimer, the term of this patent is extended or adjusted under 35 U.S.C. 154(b) by 79 days.

(21) Appl. No.: 13/137,203

(22) Filed: Jul. 27, 2011

(65) Prior Publication Data

US 2012/0025913 A1 Feb. 2, 2012

(30) Foreign Application Priority Data

Jul. 28, 2010 (JP) ................................. 2010-169019

(51) Int. Cl.
*H03G 3/20* (2006.01)
(52) U.S. Cl.
USPC ............................ 330/136; 330/127; 330/297
(58) Field of Classification Search
USPC .................................. 330/136, 296, 297, 127
See application file for complete search history.

(56) References Cited

U.S. PATENT DOCUMENTS 6,300,826 B1 10/2001 Mathe et al.
6,583,664 B2 6/2003 Mathe et al.
2009/0289720 A1 11/2009 Takinami et al.

FOREIGN PATENT DOCUMENTS

JP 2003-533116 A 11/2003
WO WO 01/86806 A3 11/2001

OTHER PUBLICATIONS

A 45/46/34% PAE Linear Polar Transmitter for EDGE/WCDMA/Mobile-WiMax (Jinsung Choi, Dongsu Kim, Daehyun Kang, Myoungsu Jun, Boshi Jin, Jungmin Park, and Bumman Kim. 978-1-4244-2804-5/09/$25.00 © 2009 IEEE).*

* cited by examiner

*Primary Examiner* — Robert Pascal
*Assistant Examiner* — Khiem Nguyen
(74) *Attorney, Agent, or Firm* — McGinn IP Law Group, PLLC

(57) ABSTRACT

An envelope amplifier includes an amplifier unit, a comparator unit and an output unit. The amplifier unit is made up of a first output section that outputs a first current in response to an amplitude of an input envelope signal, and a second output section. The second output section outputs a second current of a current value proportionate to a current value of the first current. Absolute value of the current value of the second current is greater than that of a current value of the first current. Comparator unit compares the current value of the first current. The output unit sums a current via an inductor derived from a current sustained or broken in response to a compared result of the comparator unit to the second current to deliver the resulting sum current at an output end. The first current is configured to be terminated without being delivered to the output unit (FIG. 1).

18 Claims, 21 Drawing Sheets

FIG. 21A                    RELATED ART
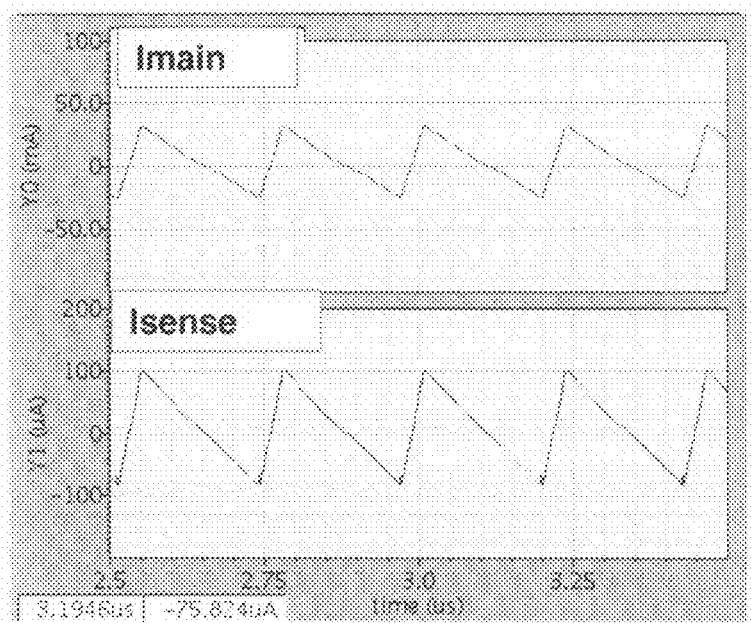
FIG. 21B                    RELATED ART
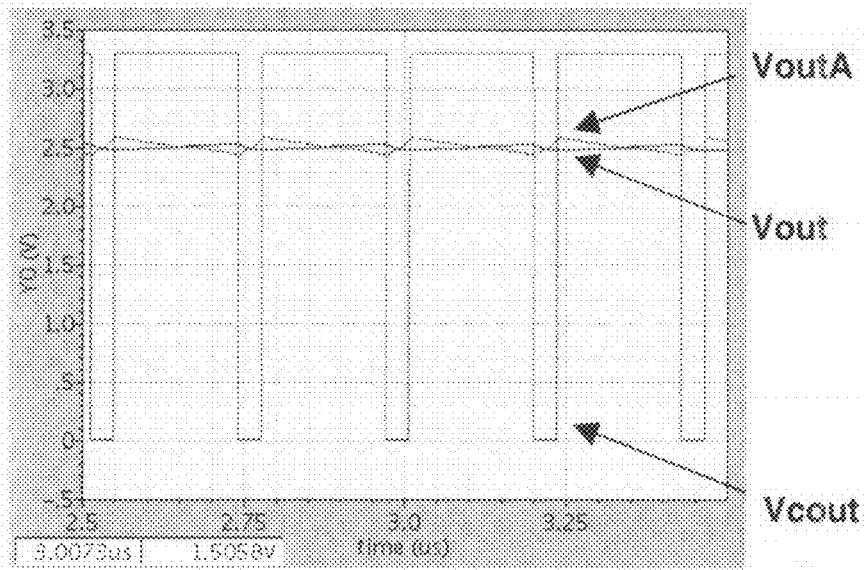

ENVELOPE AMPLIFIER

TECHNICAL FIELD

Reference to Related Application

This application is based upon and claims the benefit of the priority of Japanese patent application No. 2010-169019, filed on Jul. 28, 2010, the disclosure of which is incorporated herein in its entirety by reference thereto. This disclosure relates to an envelope amplifier and, more particularly, to an amplifier that amplifies an envelope signal in a modulated signal for wireless communication.

BACKGROUND

Recently, with increase in a data volume in wireless communication, communication standards with a high data rate have come into use. Among these standards, there are WCDMA (Wideband Code Division Multiple Access), HSUPA (High Speed Uplink Packet Access), WLAN (Wireless LAN) and LTE (Long Term Evolution). In modulated signals in the modulation system, used in these communication standards, signal envelopes are not constant. The modulated signals with non-constant envelopes suffer from a marked difference between an average power and the maximum power, viz., PAR or PARP (Peak to Average (Power) Ratio). An amplifier used to amplify the modulated signal (RFPA: Radio Frequency Power Amplifier) is required to possess a high linearity characteristic so that its output distortion will satisfy a certain desired criterion (specification) even at the maximum power time. As a result, the amplifier, exhibiting high linearity, is lowered in power efficiency except during the maximum power time, for example, during an average power time. Viz., there persists a relationship of tradeoff between the linearity and the efficiency.

As a technique to provide a breakthrough of this trade-off relationship, there has been known a method that varies the power supply voltage of the amplifier in response to an envelope signal of the modulated signal. See Patent Publications 1 and 2, for example.

FIG. 18 depicts a circuit diagram for an envelope amplifier disclosed in FIG. 4 of Patent Publication 2. An envelope amplifier 102 is made up of a linear amplifier 106, a resistor 114 (Rsense), a comparator 108 and a switching amplifier 110. The resistor 114 has its one end connected to an output terminal of the linear amplifier 106. The comparator 108 has the potentials at both ends of the resistor 114 as its input voltages, and the switching amplifier 110 has an output of the comparator 108 as its input. The output of the switching amplifier 110 is coupled to the other end of the resistor 114.

The envelope amplifier 102 delivers a current Iout, proportionate to an envelope input signal Venv, to an amplifier 104 (RFPA). The amplifier 104 has its power supply voltage Vout controlled in response to an envelope voltage of an input modulated signal RFin, whereby the amplifier 104 is improved in power efficiency.

The envelope amplifier 102 operates in response to the envelope signal Venv as follows: The linear amplifier 106 of the voltage follower configuration generates an output voltage OPout correlated with Venv to output an output voltage Vout via a resistor 114. The comparator 108 inputs the potentials at both ends of the resistor 114 to compare the potentials to each other. The switching amplifier 110 delivers an output Vout correlated with the result of comparison output by the comparator 108.

If, in this configuration, an output current Isense of the linear amplifier 106 exceeds a certain constant value, the potential difference across both ends of the resistor 114 increases. With the hysteresis voltage Vhys of the comparator 108, the output of the comparator 108 goes LOW for OPout−Vout>Vhys. An output of a switching element 112 then goes HIGH. An output voltage of the switching element 112 is coupled via the inductor 128 to the output voltage Vout. Thus, a switching current Isw is progressively increased as indicated by the following equation:

$L \cdot dIsw/dt = Vsw - Vout.$

If the switching current Isw is increased, then OPout<Vout. Part of the current Isw flows this time from the switching amplifier 110 into the linear amplifier 106. If Vout−OPout>Vhys, the output of the comparator 108 goes HIGH in level. The output of the switching element 112 now goes LOW in level, so that the switching current Isw decreases progressively.

The above described circuit, composed of the resistor 114, comparator 108 and the switching amplifier 110, ideally operates at 100 percent efficiency. The envelope amplifier 102 operates with high efficiency by setting the output current Isense so as to be sufficiently smaller than the switching current Isw.

If the envelope amplifier is implemented by a PWM type DC-DC convertor circuit, its output is connected as a power supply voltage for the amplifier 104. Hence, the switching noise poses a problem, so that the internal switching frequency must be set at a lower value. As a result, the cut-off frequency of a low-pass filter, connected to an output side, is also low, thus imposing frequency limitations on the envelope signal Venv.

If, on the other hand, the linear amplifier 106, shown in FIG. 18, is connected to the switching amplifier 110, the switching noise ascribable to the internal switching frequency, generated from the switching element 112, is absorbed by the linear amplifier 106. In this case, only the inductor 128 is connected between the switching element 112 and the output terminal Vout, thus eliminating limitations otherwise imposed on the frequency of the envelope signal Venv.

The linear amplifier 106 thus performs the role not only of generating an output proportionate to the input voltage, but also absorbing the switching noise from the switching amplifier 110. In this case, the resistance value of a resistor, connected between the linear amplifier 106 and the output voltage Vout, must be sufficiently low. However, if desired to implement the circuit shown in FIG. 18 by a CMOS circuit etc., it is difficult to set the value of the resistor 114 at a sufficiently low value keeping its accuracy, such that the resistance value of the resistor 114 will be strongly affected by process variations.

Thus, in the envelope amplifier, shown in FIG. 5 of Patent Publication 2, an output stage 214 of the linear amplifier 206 is split into two portions, as shown herein in FIG. 19. Pch MOS transistors 216, 218, abbreviated herein to PMOS transistors, hereinafter the same, constitute an output stage performing a class AB operation by voltage supplies 224, 226, and have their gates connected together. Nch MOS transistors 220, 222, abbreviated herein to NMOS transistors, hereinafter the same, similarly constitute the output stage, and have their gates connected together. It is noted that an output voltage VoutA of the first output stage (output section), made up of the PMOS transistor 216 and the NMOS transistor 220, is of approximately the same value as the output voltage Vout of the second output stage (output section) made up of the PMOS transistor 218 and the NMOS transistor 222. Hence, the relationship between the output current Imain of the output stage made up of the PMOS transistor 218 and the NMOS transistor 222 and the output current Isense of the output stage made up of the PMOS transistor 216 and the NMOS transistor 220 is determined by a size ratio n of the output stage MOS transistors, such that Imain=n·Isense.

If, in the envelope amplifier 202, constructed as described above, it is desired to set the resistance value of the resistor 114 in FIG. 18 at i.e. 0.01 ohm, it is sufficient for the resistance value of a resistor 227 to be 10 ohm in FIG. 19 on the condition that the current Isense is set at one-thousandth of the current Imain. Hence, the envelope amplifier may readily be implemented by a CMOS circuit. Moreover, there is no necessity to introduce a resistor between the switching amplifier 210 and the linear amplifier 206 that is designed to remove the switching noise produced in the switching amplifier 210. It is thus possible to provide for higher circuit performance than is possible with the circuit configuration shown in FIG. 18.

[Patent Document 1]
Japanese Patent Kokai Publication No. JP2003-533116A
[Patent Document 2]
US Patent Application Publication No. US2009/0289720A1

SUMMARY

The disclosures of above Patent Documents are incorporated herein by reference thereto in their entirety. The following analysis is given by the present disclosure.

With the circuit configuration in FIG. 19, the limitation that the resistor 227 is to be of an extremely small resistance value may be removed.

Meanwhile, if attention is focused on the operation of the comparator 208 in FIG. 19, the voltage across both ends of the resistor 207, applied to the comparator 208, varies in a range from GND to Vsupply in response to the input signal to the envelope amplifier 202.

Next, a case will now be explained in which waveforms of variables, inclusive of VoutA, Vout, etc., as input signals of the envelope amplifier 202, have been found by simulation. FIG. 20A shows the main output current Imain and the sense current Isense of the linear amplifier 206 for a case where DC 0.5V is applied as input signal. It is seen that Isense is related with Imain by an equation Imain=n·Isense. FIG. 20B shows, for such case, the output voltage VoutA on the sense current side path of the linear amplifier 206 and the output voltage Vout on the main current path thereof as well as an output voltage Vcout of the comparator 208. It is seen that, with the hysteresis voltage of the comparator 208 of the order of 200 mV, Vcout goes HIGH in level for VoutA>Vout+0.2V, while going LOW in level for VoutA<Vout−0.2V, with the average value of the VoutA and Vout being approximately equal to the input voltage.

FIG. 21A shows the main output current Imain and the sense current Isense of the linear amplifier 206 for a case where DC 2.5V is applied as input signal. It is seen that, as in FIG. 20A, Isense relates with Imain by an equation Imain=n·Isense. FIG. 21B shows, for such case, the output voltage VoutA on the sense current side path and the output voltage Vout on the main current path of the linear amplifier 206 as well as the output voltage Vcout of the comparator 208. It is seen that the average value of the VoutA and Vout is approximately equal to the input voltage, as in FIG. 20B.

The comparator 208, having such VoutA and Vout as input signals, must possess a stabilized hysteresis voltage in a range from GND to Vsupply and operate at an internal oscillation frequency in the inner loop made up of the comparator 208, switching amplifier 210 and the resistor 227. Such condition may be met by the comparator 208 having an input stage composed of parallel connection of a PMOS input circuit and an NMOS input circuit, viz., an input stage of a rail-to-rail configuration, such as to assure a broad input operating range.

However, a comparator having an input stage of a rail-to-rail configuration is in need of an NMOS input circuit and a PMOS input circuit, thus complicating the circuit. In addition, a current source is needed for each of the NMOS input circuit and the PMOS input circuit. If it is desired to get the same response speed as that of the comparator comprised of the input stage made up of single conductivity type transistors, the current consumption becomes twice that of the comparator having its input stage formed by the single conductivity type transistors, because of the use of two constant current sources. Thus, there is much to be desired in the art.

In one aspect of the present disclosure, there is provided an envelop amplifier which includes an amplifier unit including a first output section that outputs a first current in response to an amplitude of an input envelope signal and a second output section that outputs a second current of a current value proportionate to that of the first current. An absolute value of the current value of the second current is greater than that of the current value of the first current. The envelope amplifier also includes a comparator unit that compares the current value of the first current, and an output unit that sums a current via an inductor derived from a current, which is sustained or broken in response to compared result of the comparator unit, to the second current to deliver a resulting sum current at an output end. The first current is configured to be terminated without being delivered to the output unit.

An envelope amplifier in a second aspect of the present disclosure includes an amplifier unit that outputs an output current in response to an amplitude of an input envelope signal, and a comparator unit that compares a current value of the output current. The envelope amplifier also includes an output unit that sums a current via an inductor derived from a current, which is sustained or broken in response to compared result of the comparator unit, to the output current to deliver the resulting sum current at an output end. The envelope amplifier further includes an operation unit that finds a difference between a low frequency component in the envelope signal and a low frequency component in a signal that has been turned into a binary signal in response to the compared result of the comparator unit. The operation unit controls the input/output characteristic in at least one out of the amplifier unit, the comparator unit and the output unit in response to the difference.

According to the present disclosure, the circuit configuration may be simplified and the current consumption decreased.

BRIEF DESCRIPTION OF THE DRAWINGS

FIGS. 21A and 21B are timing charts (2) for various portions of the second conventional envelope amplifier.

PREFERRED MODES

Figure 1:
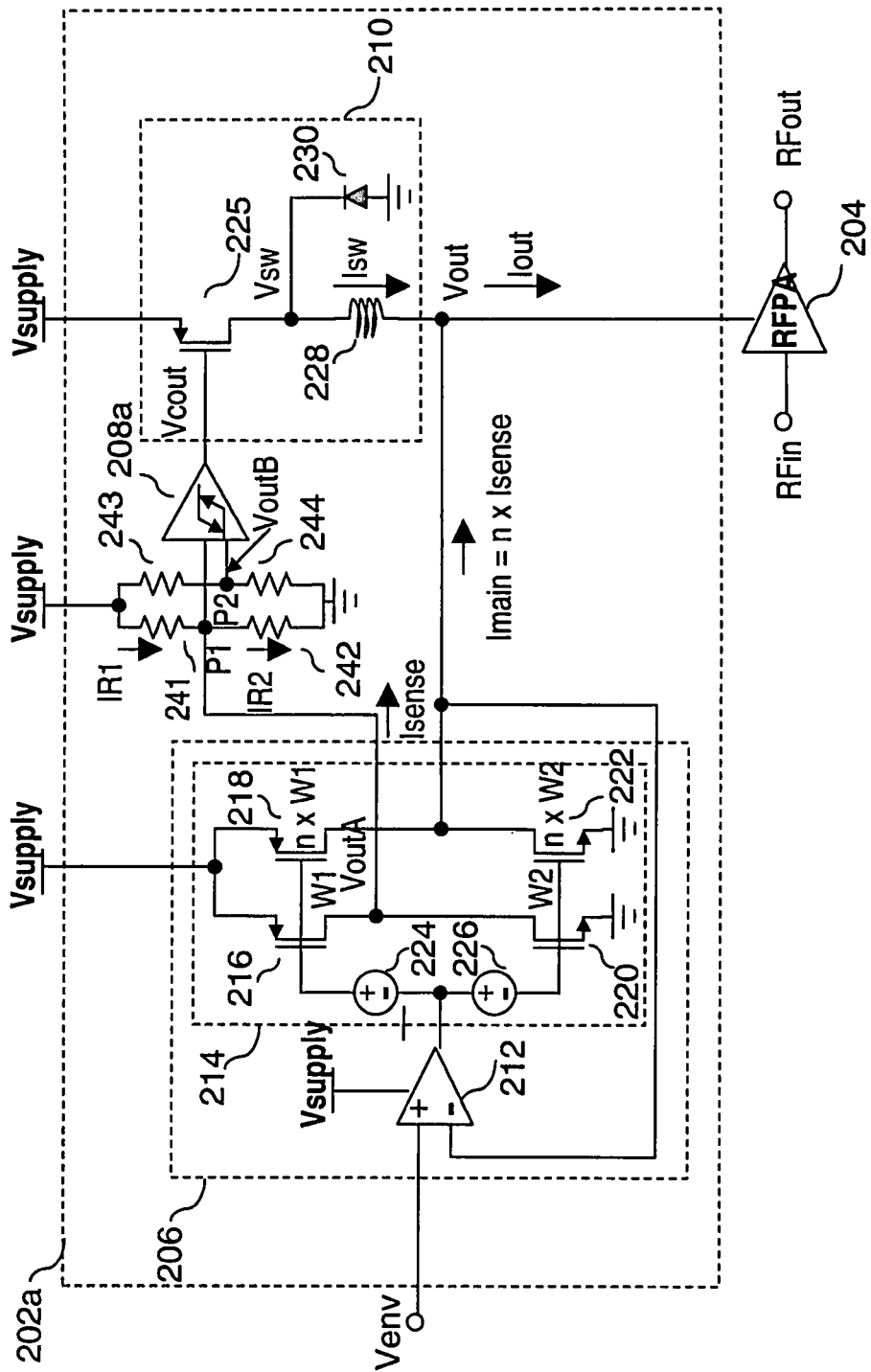
FIG. 1 is a circuit diagram of an envelope amplifier according to Example 1 of the present disclosure.

One preferred mode is outlined first, in which reference to the drawings is not restrictive to the illustrated configuration, and intended merely to assist understanding the disclosure. An envelope amplifier in one mode of the present disclosure includes an amplifier unit (206 in FIG. 1) including a first output section (216, 220 in FIG. 1) that outputs a first current (Isense in FIG. 1) in response to an amplitude of an input envelope signal and a second output section (218, 222 in FIG. 1) that outputs a second current (Imain in FIG. 1) of a current value proportionate to the current value of the first current. The absolute value of the current value of the second current is greater than that of the current value of the first current. The envelope amplifier also includes a comparator unit (208a in FIG. 1) for comparing the current value of the first current, and an output unit (corresponding to 210 in FIG. 1 and the current summing function). The output unit sums a current via an inductor (228 in FIG. 1) derived from a current, which is sustained or broken in response to compared result of the comparator unit, to the second current to deliver the resulting sum current at an output end. The first current is configured to be terminated without being delivered to the output unit.

In the envelope amplifier, the first current may be terminated in the comparator unit.

In the envelope amplifier, the comparator unit may output, as the compared result, whether the current value of the first current has exceeded a preset threshold value in one direction or has fallen short of the other preset threshold value in an opposite direction.

In the envelope amplifier, the comparator unit may include first and second input terminals that receive two voltages to be compared to each other, and a resistance element (227 of FIG. 6) connected between the first and second input terminals.

The first current may be supplied to the first input terminal and a preset bias voltage (Vb in FIG. 6) may be applied to the second input terminal.

In the envelope amplifier, the comparator unit may include first and second input terminals that receive two voltages compared to each other, and a first resistance element (257 in FIG. 5) connected between the first and second input terminals. The comparator unit may also include a second resistance element (231 in FIG. 5) connected between a first power supply and the second input terminal, and a third resistance element (232 in FIG. 5) connected between a second power supply and the second input terminal. The first current may be delivered to the first input terminal.

In the envelope amplifier, the comparator unit may include first and second input terminals that receive two voltages to be compared to each other, and a first resistance element (241 in FIG. 1) connected between a first power supply and the first input terminal. The comparator unit may also include a second resistance element (242 in FIG. 1) connected between a second power supply and the first input terminal, a third resistance element (243 in FIG. 1) connected between the first power supply and the second input terminal, and a fourth resistance element (244 in FIG. 1) connected between the second power supply and the second input terminal. The first current may be supplied to the first input terminal.

In the envelope amplifier, the comparator unit may include first and second input terminals that receive two voltages to be compared to each other, a first termination circuit (252, 254 in FIG. 7) having one end connected to the first input terminal, and a second termination circuit (253, 255 in FIG. 7) having one end connected to the second input terminal. The first current for one direction may be supplied to the first input terminal and the first current for an opposite direction to the second input terminal.

In the envelope amplifier, each of the first and second termination circuits may be made up of a series circuit of a resistor element and a diode.

In the envelope amplifier, described above, the first current is terminated without being supplied to the output unit. Hence, the input voltage in the comparator unit that compares the current value of the first current is of a narrow variation width. It is thus unnecessary to construct the input stage of the comparator unit in a rail-to-rail configuration and hence the input stage may be made up only of transistors of the single conductivity type. As a result, the comparator unit may be simplified in circuit configuration, thus reducing the current consumption.

An envelope amplifier in a second mode of the present disclosure includes an amplifier unit (206b in FIG. 10) that outputs an output current in response to an amplitude of an input envelope signal, and a comparator unit (208b in FIG. 10) that compares a current value of the output current. The envelope amplifier also includes an output unit (corresponding to 210a in FIG. 10 and current summing function) that sums a current via an inductor (228a in FIG. 10) derived from a current, which is sustained or broken in response to compared result of the comparator unit, to the output current to deliver the resulting sum current at an output end thereof. The envelope amplifier further includes an operation unit (262 in FIG. 10) that finds a difference between a low frequency component in the envelope signal and a low frequency component in a signal that has been turned into a binary signal in response to the compared result of the comparator unit. The operation unit controls an input/output characteristic in at least one out of the amplifier unit, the comparator unit and the output unit in response to the difference as found.

In the envelope amplifier, the amplifier unit may control a current value of a power supply current in the amplifier unit in response to the difference as found.

In the envelope amplifier, the comparator unit may control a current value of a power supply current in the comparator unit in response to the difference as found.

In the envelope amplifier, the output unit may control an inductance of the inductor in response to the difference as found.

In the envelope amplifier, the amplifier unit may output, as the output current, a first current and a second current, with the second current being of a current value proportionate to that of the first current and with an absolute value of the second current being greater than that of the first current. The comparator unit may compare the current value of the first current. The output unit may sum a current via an inductor derived from a current, which is sustained or broken in response to a compared result of the comparator unit, to the second current to output the resulting sum current at an output end. The first current may be configured to be terminated without being delivered to the output unit.

In the envelope amplifier, the first current may be terminated in the comparator unit.

In the envelope amplifier, the comparator unit may output, as the compared result, whether the current value of the first current has exceeded a preset threshold value in one direction or has fallen short of the other preset threshold value in an opposite direction.

In the envelope amplifier, the comparator unit may include first and second input terminals that receive two voltages to be compared to each other, and a resistance element coupled between the first and second input terminals. The first current may be supplied to the first input terminal and a preset bias voltage to the second input terminal.

In the envelope amplifier, the comparator unit may include first and second input terminals that receive two voltages compared to each other, and a first resistance element connected between the first and second input terminals. The comparator unit may also include a second resistance element connected between a first power supply and the second input terminal and a third resistance element connected between a second power supply and the second input terminal. The first current may be delivered to the first input terminal.

In the envelope amplifier, the comparator unit may include first and second input terminals that receive two voltages to be compared to each other, and a first resistance element connected between a first power supply and the first input terminal. The comparator unit may also include a second resistance element connected between a second power supply and the first input terminal, and a third resistance element connected between the first power supply and the second input terminal. The comparator unit may further include a fourth resistance element connected between the second power supply and the second input terminal. The first current may be supplied to the first input terminal.

In the envelope amplifier, the comparator unit may include first and second input terminals that receive two voltages to be compared to each other, a first termination circuit having one end connected to the first input terminal and a second termination circuit having one end connected to the second input terminal. The first current for one direction may be supplied to the first input terminal and the first current for an opposite direction to the second input terminal.

In the envelope amplifier, each of the first and second termination circuit may be formed of a series circuit of a resistance element and a diode.

With the envelope amplifier of another mode of the present disclosure, it is possible to improve the efficiency of the envelope amplifier in case load side impedance of the output unit is increased, while it is also possible to suppress variations in the internal oscillation frequency ascribable to variations in the load side impedance.

Certain Examples of the present disclosure will now be explained with reference to the drawings.

FIRST EXAMPLE

Figure 19:
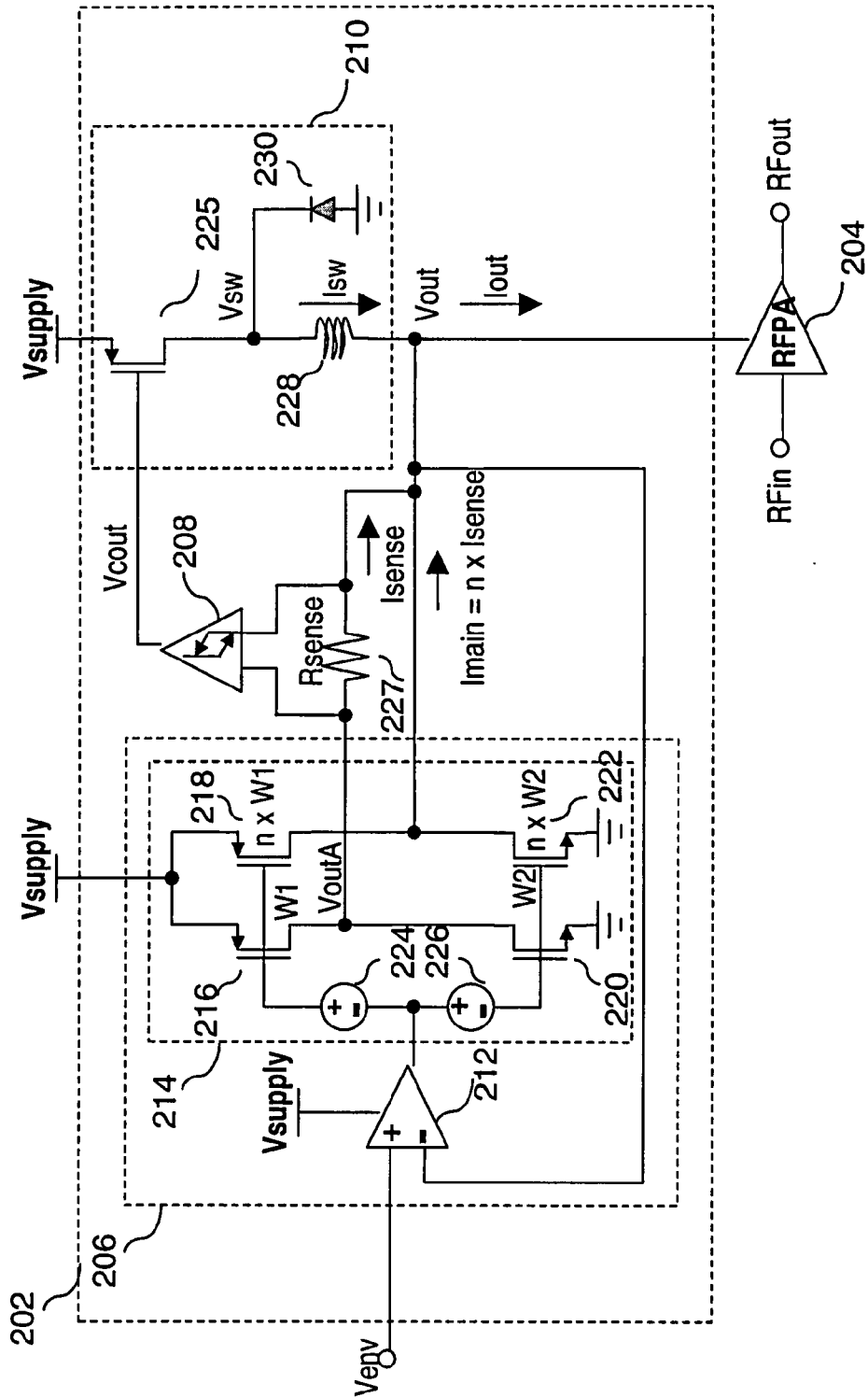
FIG. 19 is a circuit diagram showing a second conventional envelope amplifier.
Figure 20A:
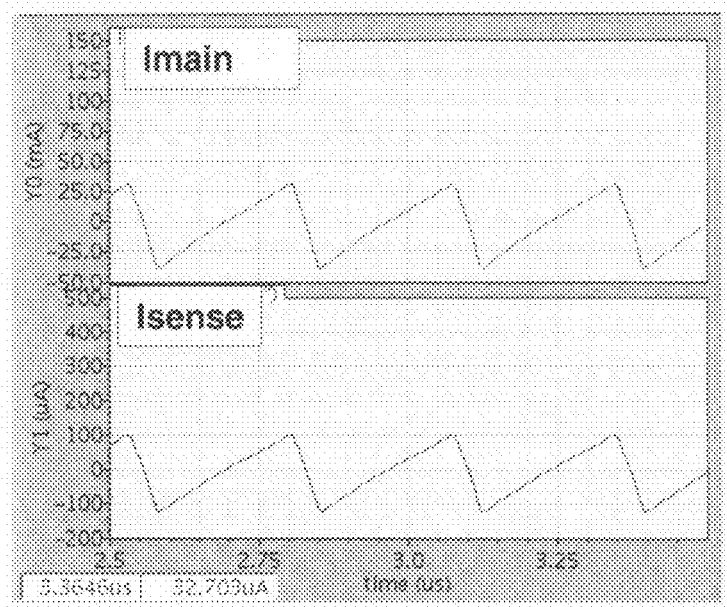
FIGS. 20A and 20B are timing charts (1) for various portions of the second conventional envelope amplifier.
Figure 20B:
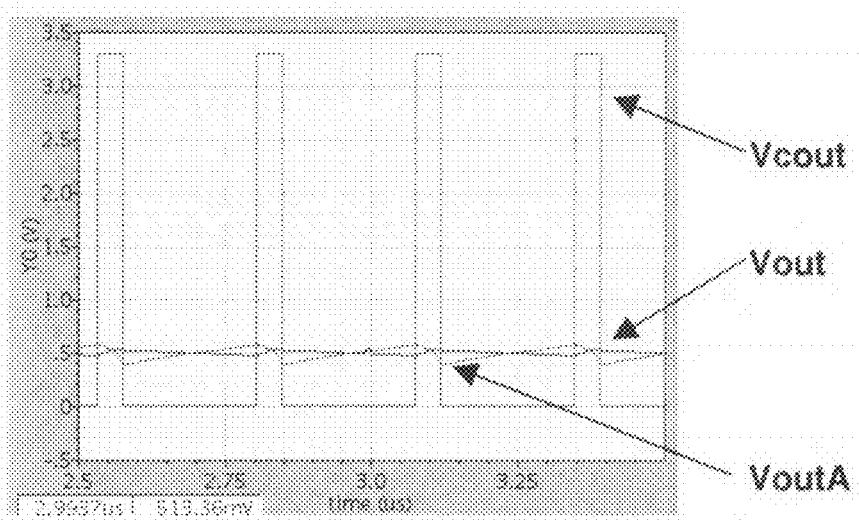

FIG. 1 depicts a circuit diagram according to Example 1 of the present disclosure. In FIG. 1, the reference numerals which are the same as those in FIG. 19 depict the same components as those in FIG. 19, and the corresponding descriptions are dispensed with. In contrast to an envelope amplifier 202 in FIG. 19, an envelope amplifier 202a in FIG. 1 includes, in place of the comparator 208 having an input stage of the rail-to-rail configuration, a comparator 208a having an input stage composed of a plurality of transistors of a single conductivity type. The envelope amplifier 202a in FIG. 1 also differs from the envelope amplifier 202 in not having the resistor 227 and in having a point P1, as a first input terminal of the comparator 208a, connected to one ends of resistors 241, 242. The envelope amplifier 202a in FIG. 1 further differs from the envelope amplifier 202 in having a point P2, as a second input terminal of the comparator 208a, connected to one ends of resistors 243, 244. The other ends of the resistors 241, 243 are connected to Vsupply, while the other ends of the resistors 242, 244 are connected to GND.

The envelope amplifier 202a is configured in a manner somewhat similar to FIG. 19, viz., a linear amplifier 206, connected in a voltage follower configuration, generates an output voltage Vout correlated with an input signal Venv, and an output stage of the linear amplifier 206 is split into two portions. Moreover, the drains of a PMOS transistor 218 and an NMOS transistor 222, performing a class AB operation by power supplies 224, 226, connected to an output terminal of a differential circuit 212, are connected to an output terminal Vout. In addition, the drains of a PMOS transistor 216 and an NMOS transistor 220, forming current mirror circuits with the PMOS transistor 218 and the NMOS transistor 222 of the output stage, are connected to an output terminal VoutA.

The output terminal VoutA is connected to a connection point of the resistors 241, 242, connected in turn between a power supply Vsupply and GND. The comparator 208a has this connection point and a connection point between the resistors 243, 244 as inputs for comparison. The resistors 243, 244 are set to the same resistance ratio as that of the resistors 241, 242.

In distinction from the case of the circuit in FIG. 19, the drain voltages of the PMOS transistors 216 and the NMOS transistor 220 differ from those of the PMOS transistors 218 and the NMOS transistor 222. However, current changes ascribable to the difference in the drain voltages are only small and do not markedly affect the circuit operation. An output of the comparator 208a is of binary values of HIGH and LOW levels and is delivered to a switching amplifier 210, an output of which is coupled to an output terminal Vout.

Figure 2:
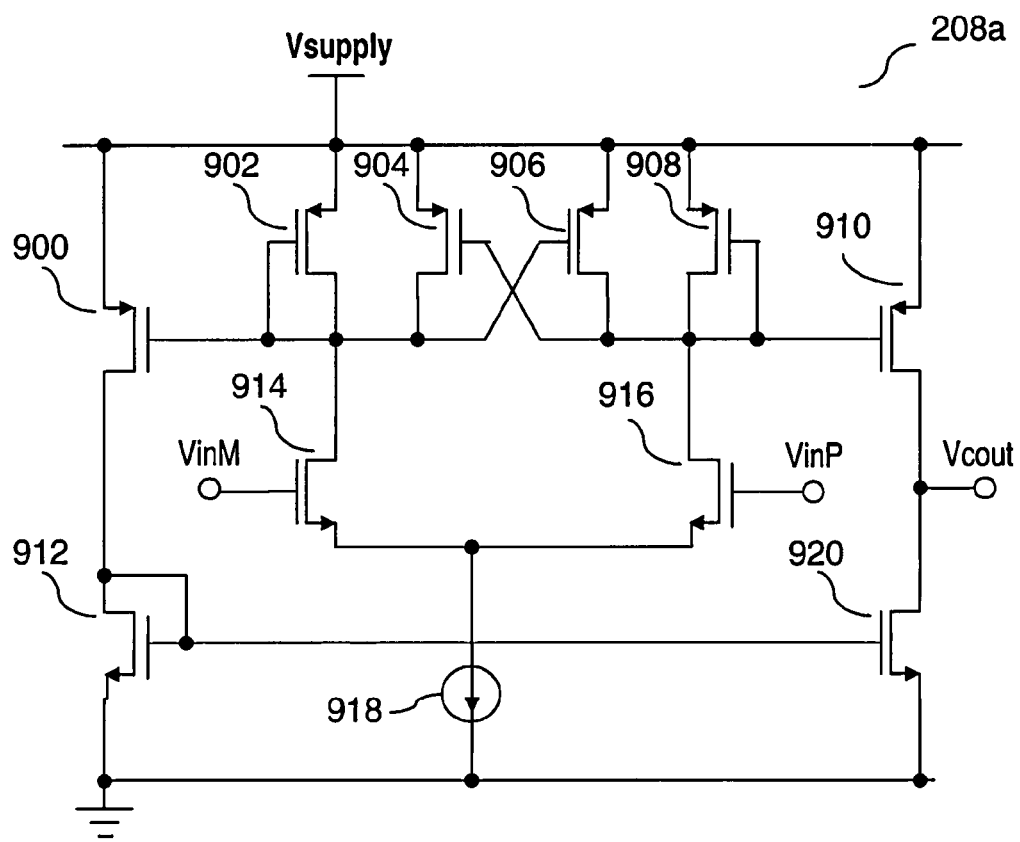
FIG. 2 is a circuit diagram of an example circuit of a comparator according to Example 1.

FIG. 2 depicts a circuit diagram showing an example circuit of the comparator 208a, which comparator 208a includes PMOS transistors 900, 902, 904, 906, 908 and 910, NMOS transistors 912, 914, 916 and 920, and a constant current source 918. The NMOS transistors 914, 916, having gates connected to input terminals VinM, VinP, as inputs for comparison, respectively, and having sources grounded common via the constant current source 918, operate as a differential pair.

The PMOS transistor 902, connected as a diode and having a source connected to the power supply Vsupply, has a drain connected to the gate of the PMOS transistor 900, the drain of the PMOS transistor 904, the gate of the PMOS transistor 906 and to the drain of the NMOS transistor 914. The PMOS transistor 908, also connected as a diode and having a source connected to the power supply Vsupply, has a drain connected to the gate of the PMOS transistor 910, the drain of the PMOS transistor 906, the gate of the PMOS transistor 904 and to the drain of the NMOS transistor 916. The PMOS transistor 900 has a source connected to the power supply Vsupply, while having a drain connected to the drain and the gate of the NMOS transistor 912 and to the gate of the NMOS transistor 920. The sources of the NMOS transistors 912, 920 are grounded. The NMOS transistor 910 has a source connected to the power supply Vsupply, while having a drain connected to the drain of the NMOS transistor 920 and to an output terminal Vcout.

The comparator 208a, described above, is a comparator having a hysteresis voltage for the comparison operation. Viz., it compares the voltages at the input terminals VinM, VinP to output the result of comparison at the output terminal Vcout. In case the driving power of the comparator 208a falls short in driving the switching MOS transistor 225, the PMOS transistor 910 and the NMOS transistor 920 may be increased in size. Or, a buffer, not shown, may be provided to drive the gate of the switching MOS transistor 225 via this buffer.

The basic operation of the envelope amplifier 202a is similar to that in FIG. 19. The linear amplifier 206, connected in a voltage follower configuration, outputs a signal, which is the same as the input signal Venv, at the output terminals VoutA and Vout. On power up, the output voltage of the comparator 208a is HIGH in level, with an output terminal Vsw of the switching MOS transistor 225 being at 0V. Hence, the current is supplied to the output terminal Vout mainly via the linear amplifier 206. If the current Imain from the linear amplifier 206 to the output terminal increases, a current proportional to the current Imain flows from the output terminal VoutA of the linear amplifier 206 to raise a potential difference at the resistor 242. Hence, the voltage VoutA becomes higher than an initial voltage determined by the voltage division ratio by the resistors 241, 242.

In case the voltage VoutA becomes higher than the potential determined by the voltage division ratio by the resistors 243, 244 plus the hysteresis voltage of the comparator 208a, the output voltage Vcout of the comparator 208a goes LOW. Hence, the switching MOS transistor 225 is turned on, as a result of which the voltage of the output terminal Vsw goes HIGH. The current Isw flowing through an inductor 228 thus becomes progressively larger. Given the relationship of Tout=Isw+Imain, the current Imain from the linear amplifier 206 then becomes progressively smaller, when it is assumed that the load current Iout is constant. If the current Imain becomes negative, the sense current Isense of the linear amplifier 206 also becomes negative, with the voltage at VoutA becoming lower than the initial voltage as determined by the voltage division ratio of the resistors 241, 242.

When VoutA becomes smaller than the potential as determined by the voltage division ratio of the resistors 243, 244 minus the hysteresis voltage of the comparator 208a, the output of the comparator 208a goes HIGH in level to turn off the switching MOS transistor 225. Hence, the current flowing through the inductor 228 is progressively decreased. As the current Isw becomes progressively smaller, the current Imain from the linear amplifier 206 is increased progressively so that the sense current Isense flowing from VoutA is also increased. The voltage at VoutA becomes greater than the initial voltage as determined by the voltage division ratio of the resistors 241, 242. The output of the comparator 208a then goes LOW in level.

Figure 3A:
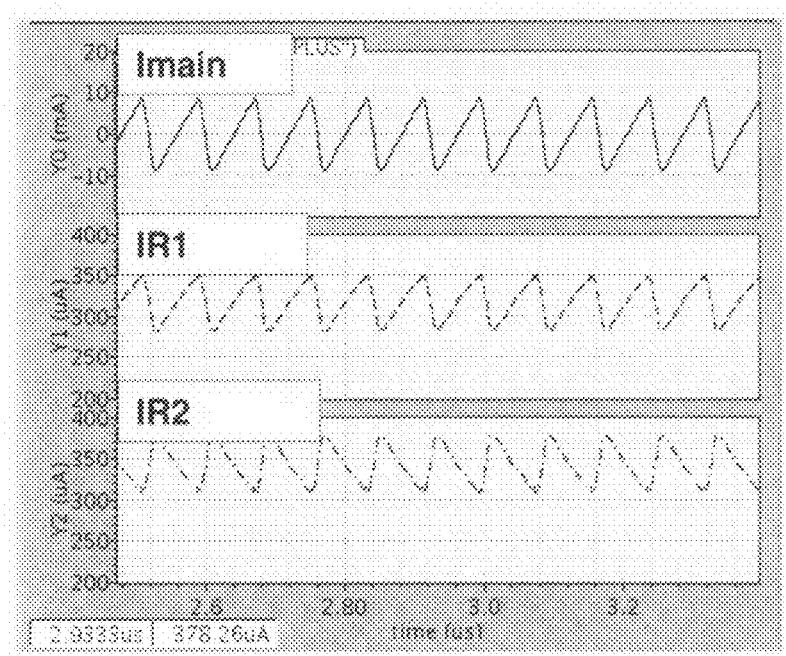
FIGS. 3A and 3B are timing charts (1) for various portions of the envelope amplifier according to Example 1.

FIGS. 3A, 3B and FIGS. 4A, 4B depict timing charts for various portions of the circuit as found by simulation. FIG. 3A shows, for a case where DC 0.5V is applied as input signal, the main current Imain delivered from an output stage of the PMOS transistors 218 and the NMOS transistor 222 of the linear amplifier 206, and currents IR1, IR2. These currents IR1, IR2 correspond to Isense which is the mirror current of the main current Imain. It is seen that the amplitude of each of IR1 and IR2 is correlated to that of Imain by a relationship: Imain=n·Isense.

Figure 3B:
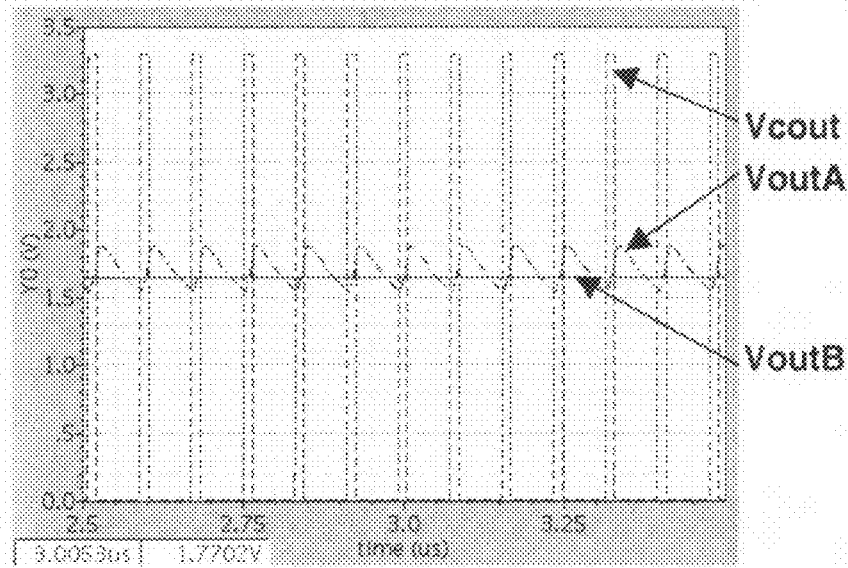

FIG. 3B shows, for the case where DC 0.5V is applied as input signal, the output voltage Vcout of the comparator 208a, the divided voltage VoutA of the resistors 241, 242 and the divided voltage VoutB of the resistors 243, 244. The voltage VoutB remains constant, whereas the voltage VoutA varies with increase/decrease of the current Imain. It is seen that, with the hysteresis voltage Vhys of the comparator 208a, Vcout is LOW in level for VoutA=VoutB+Vhys and HIGH in level for VoutA=VoutB−Vhys.

Figure 4A:
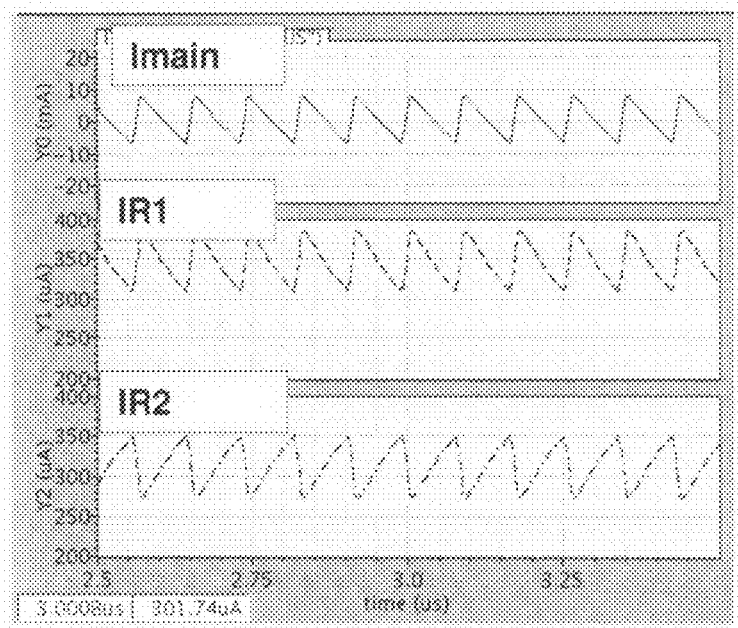
FIGS. 4A and 4B are timing charts (2) for various portions of the envelope amplifier according to Example 1.

FIG. 4A shows, for a case where DC 2.5V is applied as input signal, the main current Imain delivered from an output stage composed of the PMOS transistors 218 and the NMOS transistor 222 of the linear amplifier 206, and currents IR1, IR2. These currents IR1, IR2 correspond to Isense which is the mirror current of the main current Imain. It is seen that the amplitudes of the currents IR1, IR2 are correlated to Imain by a relationship: Imain=n·Isense, in the same way as in FIG. 3A.

Figure 4B:
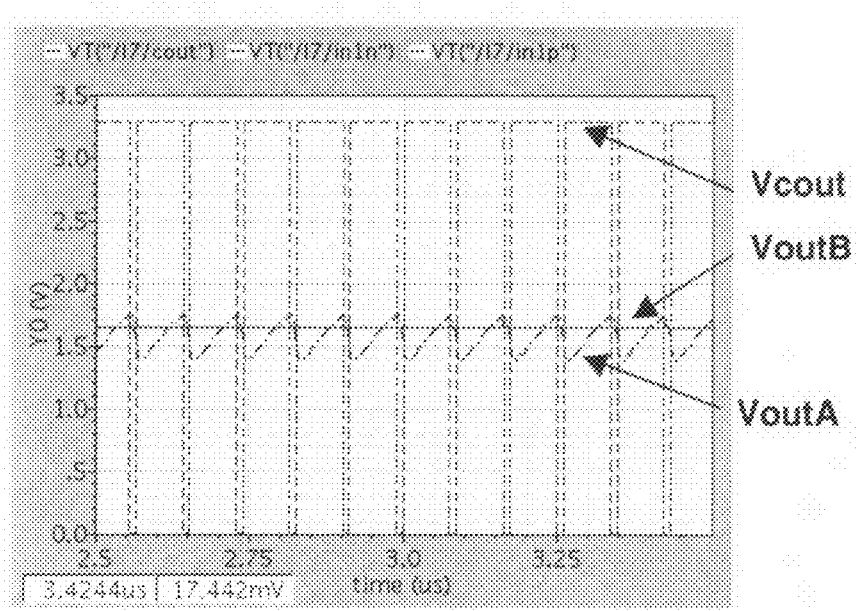

FIG. 4B shows, for a case where DC 2.5V is applied as input signal, the output voltage Vcout of the comparator 208, the divided voltage VoutA of the resistors 241, 242 and the divided voltage VoutB of the resistors 243, 244. It is seen that, with VoutA=VoutB+Vhys, the output voltage Vcout of the comparator 208a goes LOW, whereas, with VoutA=VoutB−Vhys, the output voltage Vcout of the comparator 208a goes HIGH, in the same way as in FIG. 3B. Hence, the operation itself of the comparator 208a is substantially unchanged from the case in FIG. 19, such that it is possible to maintain the DC level of the input signal of the comparator 208a substantially constant.

The loop composed of the linear amplifier 206, resistors 241-244, comparator 208a and the switching amplifier 210 reiterates the above mentioned operation. By this reiterated operation, the major portion of Iout, which is the driving current of the envelope amplifier 202a, and which is to be the power supply current for the amplifier 204, may be supplied from the switching amplifier 210, and the remaining portion thereof may be supplied from the linear amplifier 206. Doing so may thus provide an amplifier of high efficiency. Moreover, the switching noise derived from the switching amplifier 210 may be allowed to flow through the linear amplifier 206 and hence may be reduced.

With the above described envelope amplifier, the average value of the input voltage of the comparator 208a may be made substantially constant without dependency upon the input signal Venv of the envelope amplifier 202a. Hence, the comparator 208a may be simplified in circuit configuration by having its input stage formed by multiple transistors of the single conductivity type, as shown in FIG. 2. In addition, the current consumption of the comparator 208a may be reduced.

SECOND EXAMPLE

Figure 5:
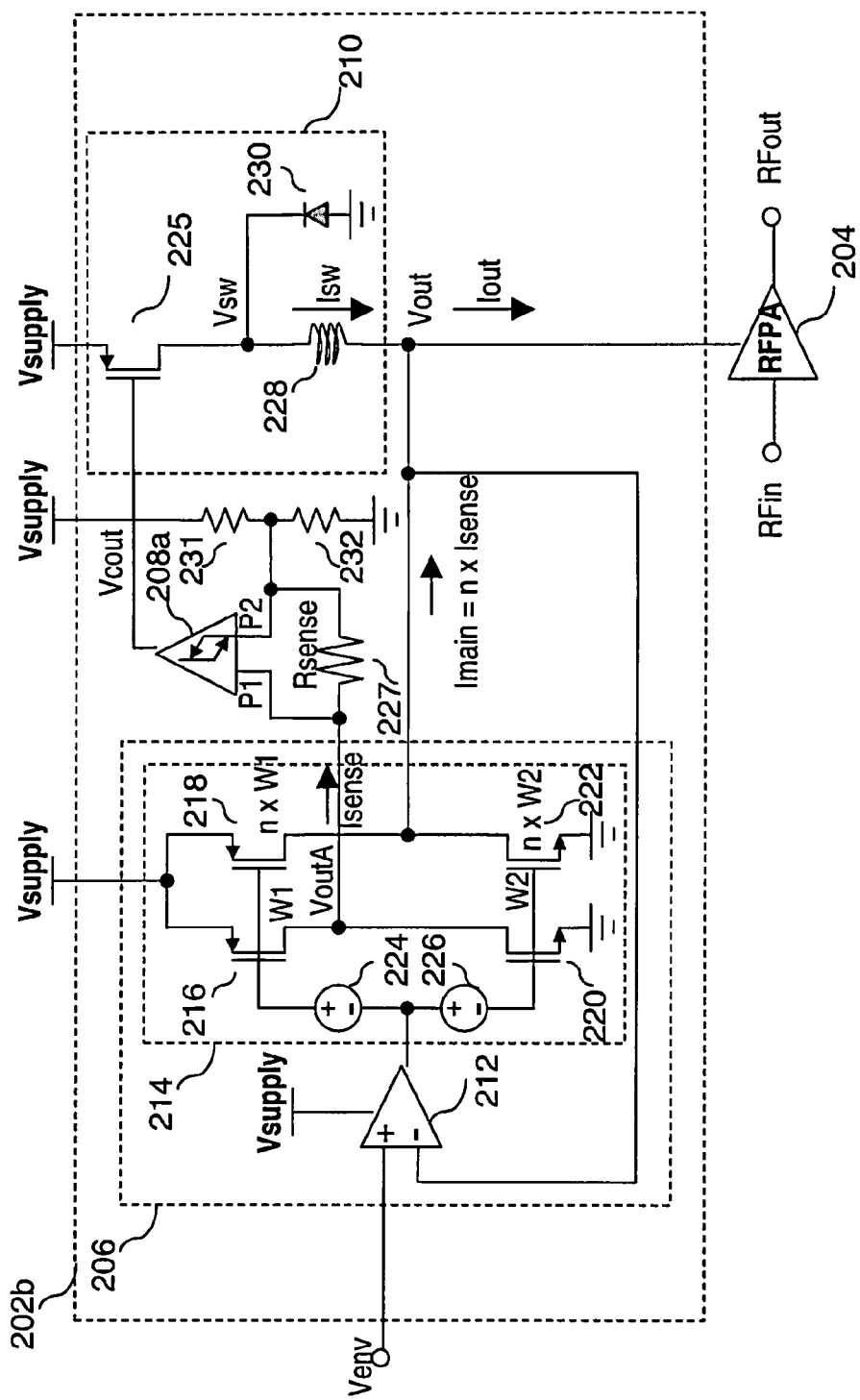
FIG. 5 is a circuit diagram of an envelope amplifier according to Example 2 of the present disclosure.

FIG. 5 depicts a circuit diagram of an envelope amplifier of Example 2 of the present disclosure. In FIG. 5, the reference numerals which are the same as those shown in FIG. 1 depict the same components and hence the corresponding description is dispensed with. In contrast to the envelope amplifier 202a in FIG. 1, an envelope amplifier 202b in FIG. 5 is not provided with the resistors 241, 242, and the resistor 227 is provided between connection points P1 and P2 operating as first and second input terminals of the comparator 208a. It is noted that resistors 231, 232 are connected in a manner similar to the resistors 243, 244 in FIG. 1.

The envelope amplifier 202b, constructed as described above, operates in the same way as the envelope amplifier 202a of Example 1. The circuit formulation of the comparator 208a may be made simpler and the current consumption in the comparator 208a may be decreased. In addition, the resistors 241, 242, the current flows through from Vsupply to GND, are not provided, thus further decreasing the current consumption.

THIRD EXAMPLE

Figure 6:
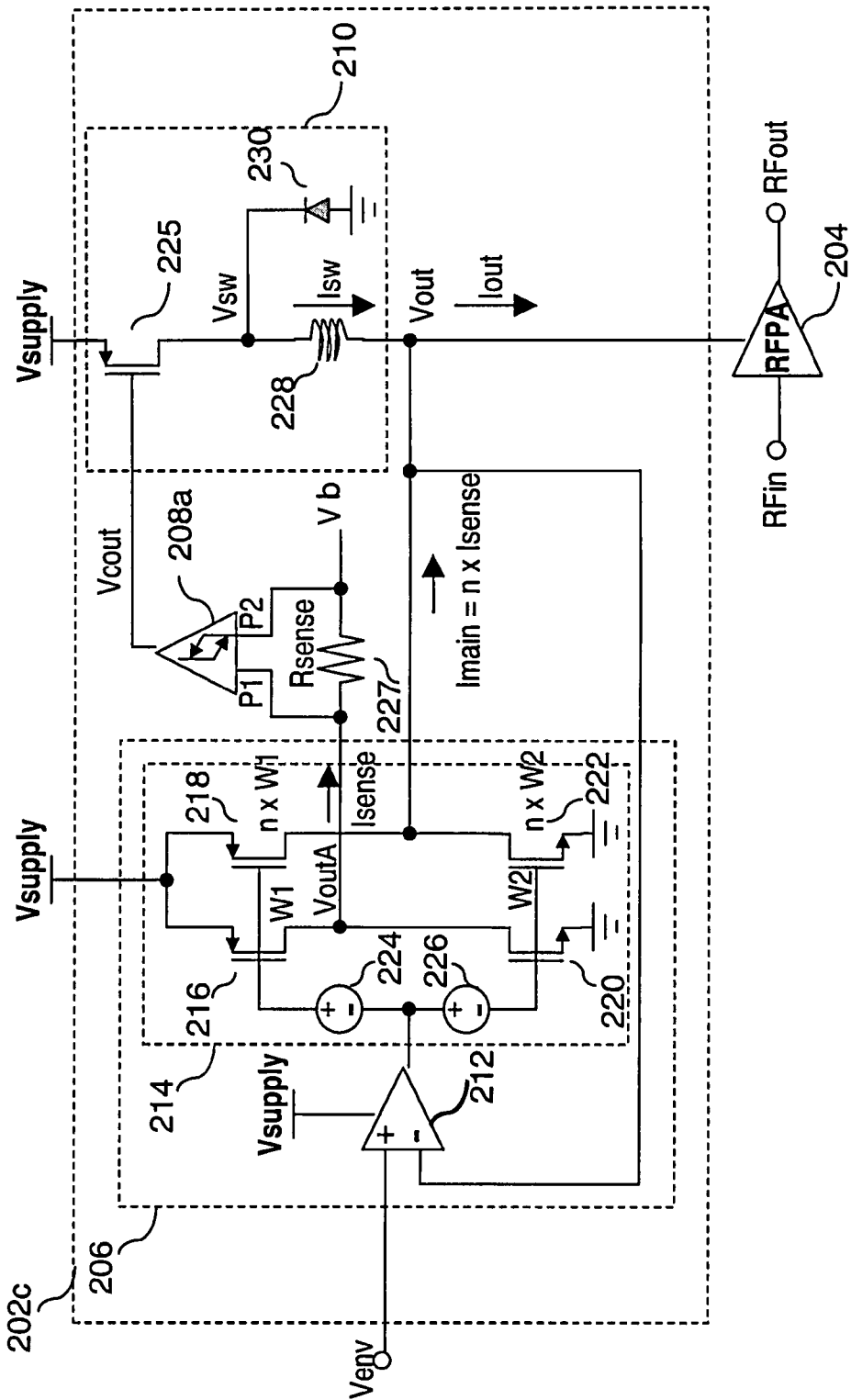
FIG. 6 is a circuit diagram of an envelope amplifier according to Example 3 of the present disclosure.

FIG. 6 depicts a circuit diagram of an envelope amplifier of Example 3 of the present disclosure. In FIG. 6, the same reference numerals as those shown in FIG. 5 depict the same components and hence the corresponding description is dispensed with. In contrast to the envelope amplifier 202b shown in FIG. 5, an envelope amplifier 202c shown in FIG. 6 is not provided with the resistors 243, 244, and the connection point P2, as second input terminal of the comparator 208a, is connected to a bias voltage Vb, which bias voltage is equivalent to a voltage at the connection point P2 in FIG. 1.

The envelope amplifier 202c operates similarly to the envelope amplifier 202a of Example 1. The circuit configuration of the comparator 208a may be made simpler and the current consumption in the comparator 208a may be decreased. In addition, the resistors 241 to 244, the current flows through from Vsupply to GND, are not provided, thus further decreasing the current consumption.

FOURTH EXAMPLE

Figure 7:
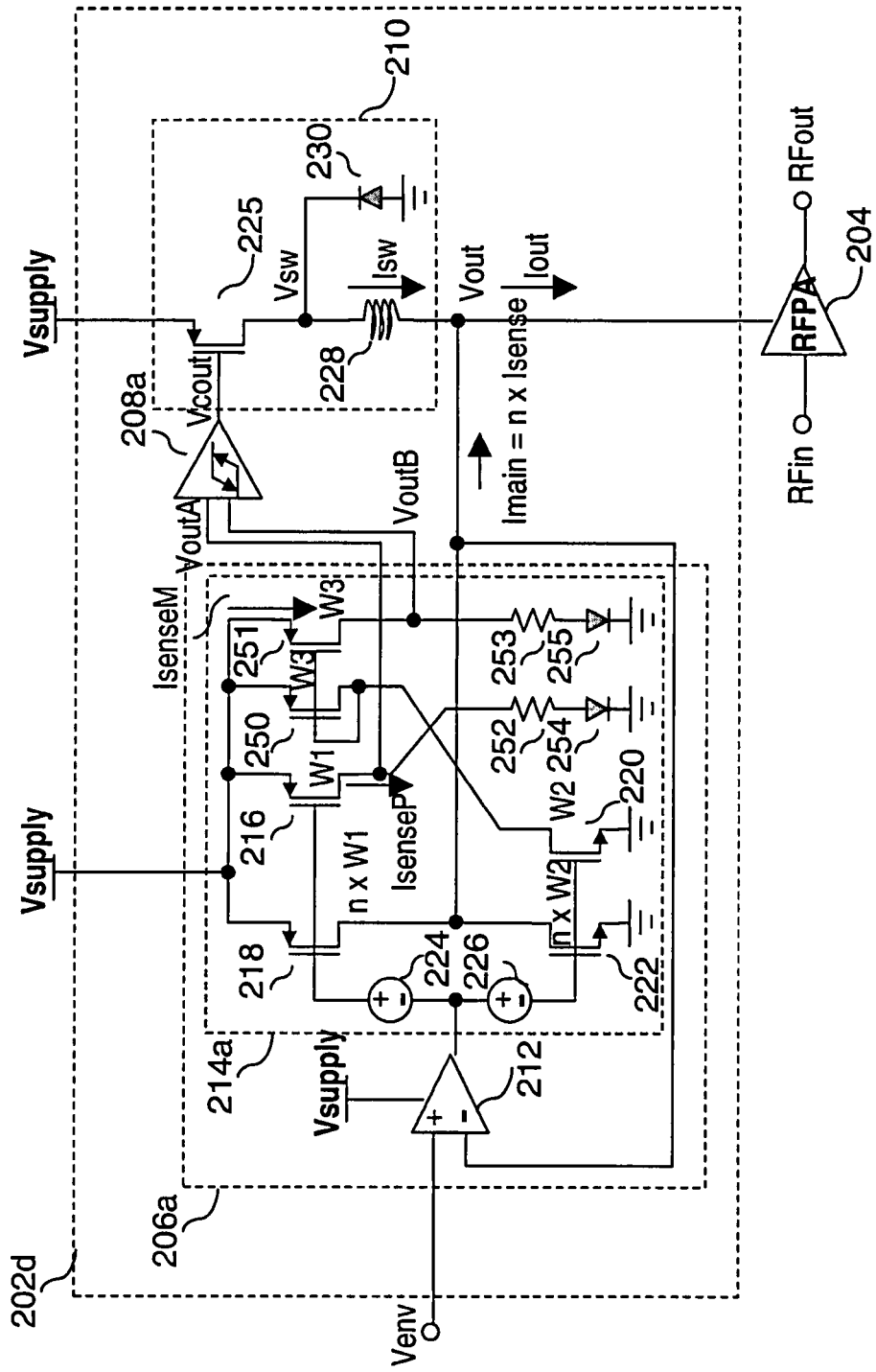
FIG. 7 is a circuit diagram of an envelope amplifier according to Example 4 of the present disclosure.

FIG. 7 depicts a circuit diagram of an envelope amplifier of Example 4 of the present disclosure. In FIG. 7, the reference numerals which are the same as those shown in FIG. 1 depict the same components and hence the corresponding description is dispensed with. In contrast to the envelope amplifier 202a in FIG. 1, an envelope amplifier 202d in FIG. 7 is not provided with the resistors 241 to 244, and a linear amplifier 206a is provided in place of the linear amplifier 206. Additionally, first and second input terminals of the comparator 208a are connected to the linear amplifier 206a.

The linear amplifier 206a differs from the linear amplifier 206 in FIG. 1 in the configuration of the output stage 214. Viz., the linear amplifier 206a has an output stage 214a including PMOS transistors 250, 251, resistors 252, 253, and diodes 254, 255.

A PMOS transistor 216 has a gate and a source connected common to a gate and a source of a PMOS transistor 218, respectively. The drain of the PMOS transistor 216 is connected to a series circuit composed of the resistor 252 and the diode 254. An NMOS transistor 220 has a gate and a source connected common to a gate and a source of an NMOS transistor 222, respectively. The drain of the NMOS transistor 220 is connected to the gate and the drain of a PMOS transistor 250 and to the gate of a PMOS transistor 251. The PMOS transistor 251 has a gate and a source connected common to a gate and a source of the PMOS transistor 250, respectively. The drain of the PMOS transistor 251 is connected to a series circuit composed of the resistor 253 and the diode 255. In the comparator 208a, the drains of the PMOS transistor 216 and the PMOS transistor 251 are connected to input terminals thereof. The diodes 254, 255 perform the role of potential adjustment based on their forward voltages. The PMOS transistors 250, 251 are to be of the same size.

As in the case in FIG. 1, if the main current Imain delivered from the output stage of the linear amplifier 206a connected to the output terminal Vout flows out from the output stage of the linear amplifier 206a (Imain≧0), the current flows through the PMOS transistor 218. Since the PMOS transistor 216 forms a current mirror together with the PMOS transistor 218, a current IsenseP, flowing through the PMOS transistor 216, is proportionate to Imain. The drain voltage VoutA of the PMOS transistor 216 is determined by the current IsenseP flowing through the series circuit of the resistor 252 and the diode 254 operating as a termination circuit. The voltage VoutA increases in proportion to Imain.

The main current Imain flowing into the output stage of the linear amplifier 206a (Imain≦0) flows via the NMOS transistor 222. Since the NMOS transistor 220 forms a current mirror together with the NMOS transistor 222, a current IsenseM, flowing through the NMOS transistor 220, is proportionate to the current Imain. By the current mirror configuration of the PMOS transistors 250, 251, connected to the drain of the NMOS transistor 220, the current IsenseM, flowing through the NMOS transistor 220, is folded back so as to flow through the PMOS transistor 251. The drain voltage VoutB of the PMOS transistor 251 is determined by the current IsenseM flowing through the series circuit of the resistor 253 and the diode 255 as the termination circuit. The voltage VoutB increases in proportion to the current Imain.

The mirror currents of the steady-state current, flowing through the PMOS circuit 218 and the NMOS circuit 222, as output stage of the linear amplifier 206a, flow through the PMOS transistor 216 and the NMOS transistor 220. The current IsenseP, flowing through the PMOS transistor 216, becomes equal to the current IsenseM flowing through the PMOS transistor 251. The initial values of the voltages VoutA and VoutB are determined by the current IsenseP flowing through the series circuit of the resistor 252 and the diode 254, and the current IsenseM through the series circuit of the resistor 253 and the diode 255.

In the above described circuit configuration, the input voltages VoutA, VoutB of the comparator 208a are varied in response to the output current Imain of the PMOS transistor 218 and the NMOS transistor 222 of the output stage of the linear amplifier 206a. Hence, the circuit operation becomes equal to that in FIG. 1.

At this time, the steady-state currents flowing through the circuit made up of the PMOS transistor 216, NMOS transistor 220, PMOS transistors 250, 251, resistors 252, 253 and the diodes 254, 255, are the mirror currents of the steady-state current of the PMOS transistor 218 and the NMOS transistor 222. It is thus possible to reduce current consumption in comparison with the case in FIG. 1.

Figure 8A:
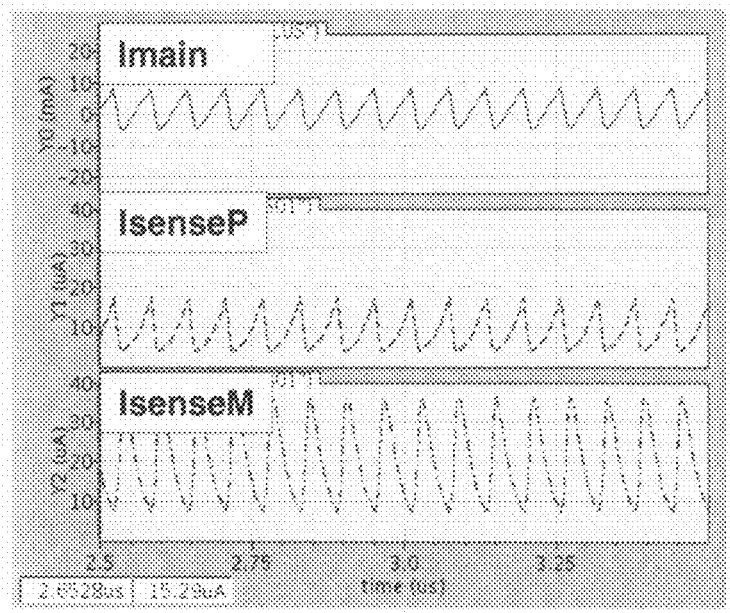
FIGS. 8A and 8B are timing charts (1) for various portions of the envelope amplifier according to Example 4.
Figure 8B:
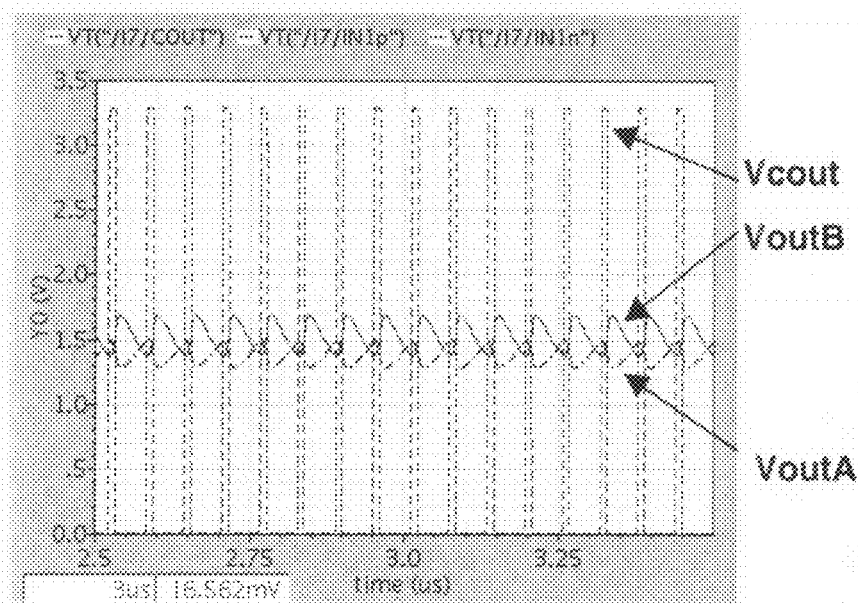

FIGS. 8A, 8B and FIGS., 9A, 9B depict timing charts for various portions obtained on simulation of the above mentioned operation. FIG. 8A shows the main current Imain in the linear amplifier 206, the sense current IsenseP flowing through the PMOS transistor 216 and the sense current IsenseM flowing through the PMOS transistor 251 in case the DC 0.5V is applied as the input signal. It may be seen that, when the current Imain increases, the currents IsenseP and IsenseM increase and decrease, respectively.

FIG. 8B shows the output voltage Vcout and input voltages VoutA, VoutB of the comparator 208a in case of applying the DC 0.5V as the input signal. If, with the hysteresis voltage Vhys of the comparator 208a, VoutA=VoutB+Vhys, the output Vcout of the comparator 208a goes HIGH in level. The output of the switching amplifier 210 also goes HIGH in level. The output current Imain of the linear amplifier 206a thus decrease gradually, the current IsenseP decreases, the curent IsenseM increases, VoutA decreases and VoutB increases.

In case VoutA=VoutB−Vhys, Vcout goes LOW, with the output of the switching amplifier 210 also going LOW. Hence, the output current Imain of the linear amplifier 206a increases gradually, the current IsenseP increases, the current IsenseM decreases, VoutA increases and VoutB decreases. When VoutA=VoutB+Vhys, Vcout goes HIGH. The above mentioned operation is iterated.

Figure 9A:
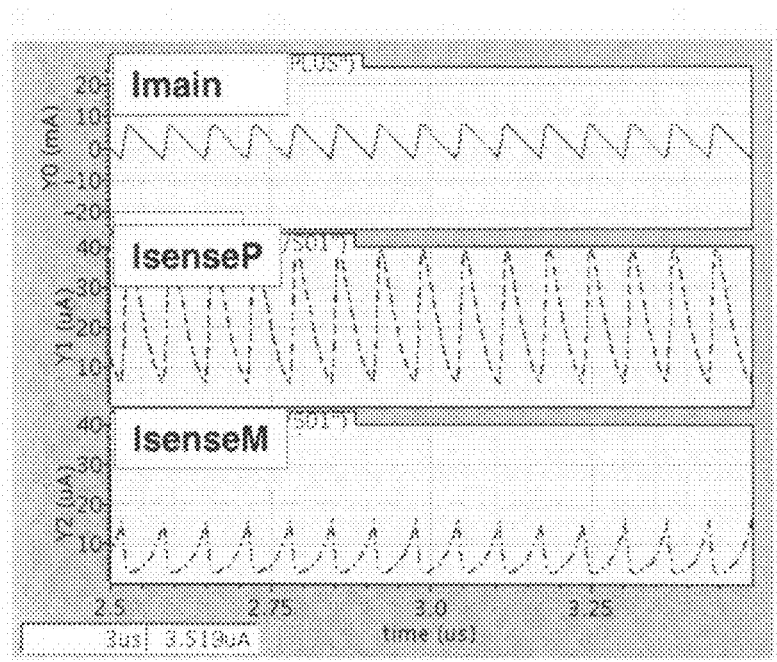
FIGS. 9A and 9B are timing charts (2) for various portions of the envelope amplifier according to Example 4.
Figure 9B:
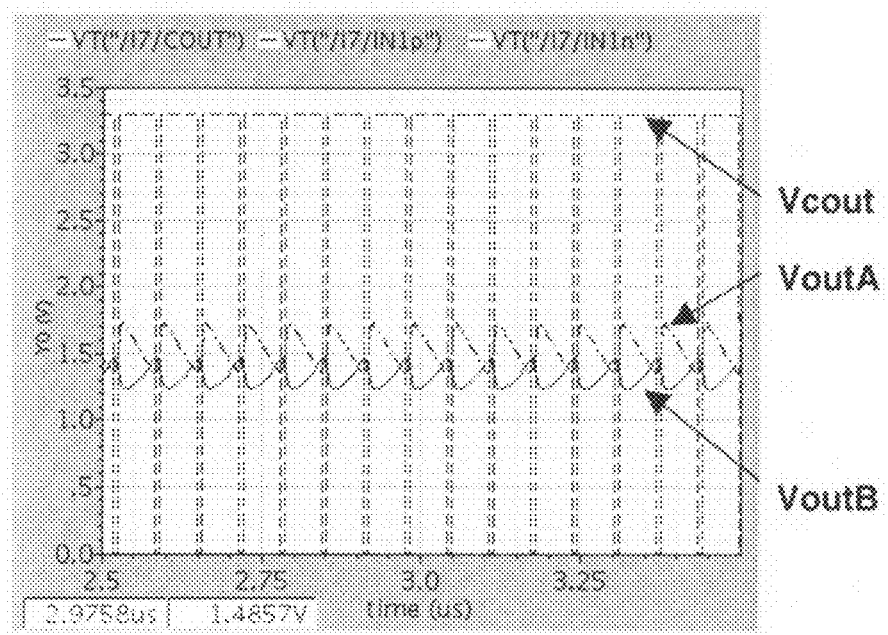

FIG. 9A shows the main current Imain in the linear amplifier 206a, the sense current IsenseP flowing through the PMOS transistor 216 and the sense current IsenseM flowing through the PMOS transistor 251 in case the DC 2.5V is applied as the input signal. It may be seen that, when the output current Imain of the linear amplifier 206a increases, the currents IsenseP and IsenseM increase and decrease, respectively, as in FIG. 8A. FIG. 8B shows the output voltage Vcout and input voltages VoutA, VoutB of the comparator 208a in case of applying the DC 2.5V as the input signal.

With the envelope amplifier 202d, described above, the current consumption may be decreased in comparison with the case of Example 1.

FIFTH EXAMPLE

Figure 18:
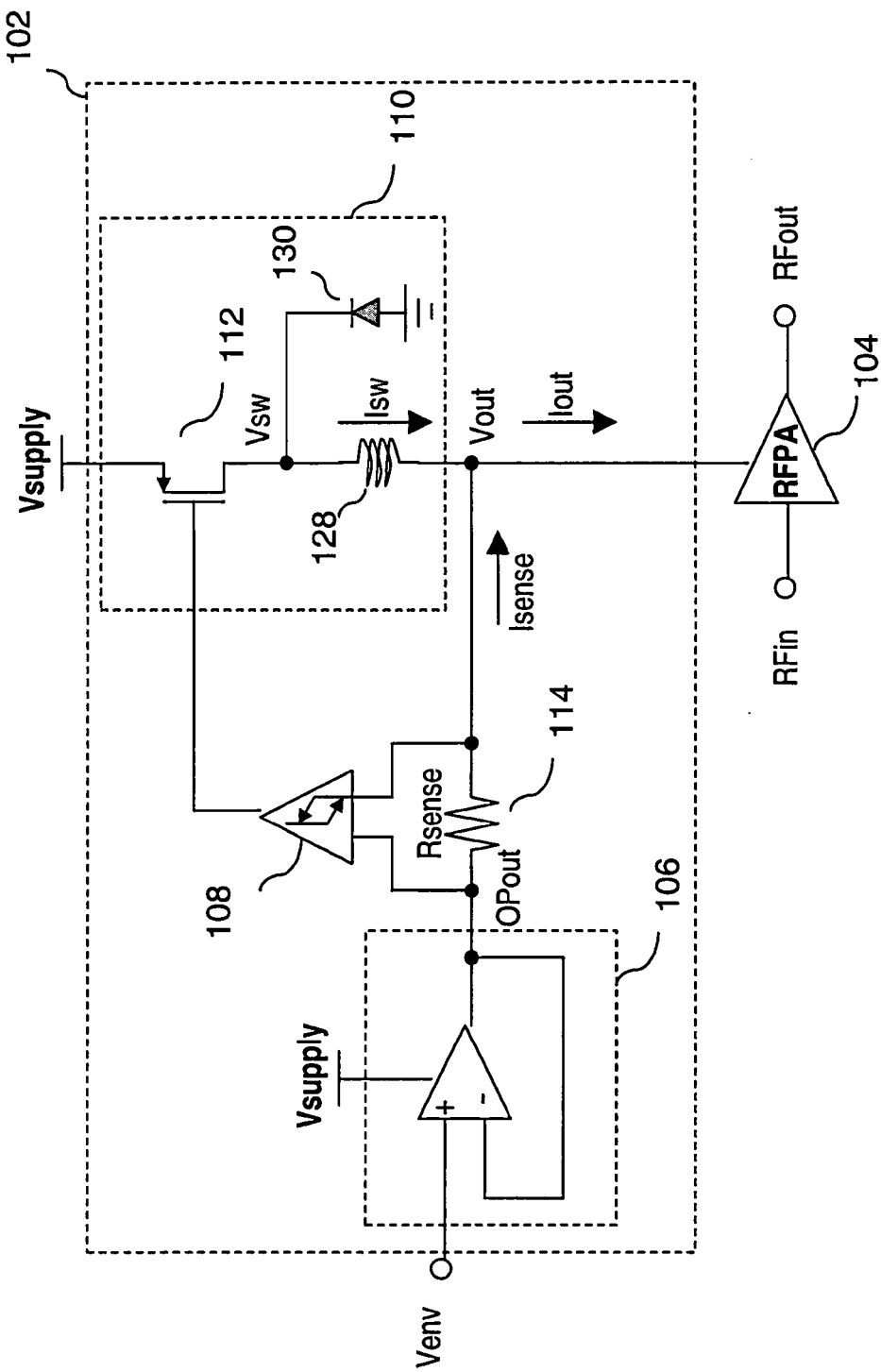
FIG. 18 is a circuit diagram showing a first conventional envelope amplifier.

The currents consumed in the circuit of the envelope amplifier 102, shown in FIG. 18, may be enumerated by the current consumed in the inside of the linear amplifier 106, the current consumed in the comparator 108 and the switching loss in the switching operation of the switching amplifier 110.

A ripple voltage Vout_ripple of the output voltage Vout of the envelope amplifier 102 is now scrutinized. The ripple voltage Vout_ripple may be expressed by the following equations:

$$V_{out\_ripple} = I_{sw\_ripple} \cdot (Z_{out} \| R_{Load})$$

$$Z_{out} = R_{out}/(1+\beta A)$$

where Zout is the output impedance of the linear amplifier 106, RLoad is the impedance of the amplifier 104 looking from the output terminal Vout, and Isw_ripple is the ripple current of the switching current Isw flowing through the inductor 128 inside the switching amplifier 110. In addition, Rout is the output impedance of the output stage of the linear amplifier 106, β is a feedback constant and A is the gain. Note, the symbol ∥ denotes the parallel connection.

It is seen from the above equations that, to decrease the ripple of the output voltage Vout, it is sufficient to decrease either Isw_ripple or the output impedance of the linear amplifier 106.

To decrease Isw_ripple, it is necessary to increase the internal oscillation frequency in an inner loop composed of the linear amplifier 106, comparator 108 and the switching amplifier 110. To decrease the output impedance of the linear amplifier 106, on the other hand, it is necessary to increase either the device size of the output stage of the linear amplifier 106 or the gain.

First, in case the internal oscillation frequency is increased, it is apparent that the switching loss in the switching amplifier 110 is increased. On the other hand, if the size of the elements of the output stage of the linear amplifier 106 is increased, the bandwidth of the linear amplifier 106 is narrower. Hence, limitations are imposed on increasing the size of the output stage devices. Also, to increase the gain of the linear amplifier 106, the current consumed in the inside of the linear amplifier 106 is to be increased. After all, the current consumption is increased. Hence, the current consumption and the ripple of the output voltage are in a relationship of tradeoff to each other.

Attention should now be focused on the fact that the impedance Rload of the amplifier 104 looking from the output terminal Vout of the envelope amplifier 102 may be varied. Thus, to satisfy the condition for the ripple in the output voltage, it is necessary to design the envelope amplifier 102 in keeping with the smallest value of the impedance Rload. When in this case, the impedance Rload of the amplifier 104 looking from the output terminal Vout becomes higher, the efficiency of the envelope amplifier 102 is lowered. When the impedance Rload of the amplifier 104 looking from the output terminal Vout becomes higher, the inner oscillation frequency in the inner loop made up of the linear amplifier 106, comparator 108 and the switching amplifier 110 is varied.

An envelope amplifier of Example 5 of the present disclosure addresses to this problem. Example 5 will now be explained with FIG. 1 as basis, viz., only the portions changed from FIG. 1 will be explained. However, Example 5 may also be based on the cases in FIG. 5 to FIG. 7, FIG. 17 and FIG. 19 and may be applied to these cases as well.

Figure 10:
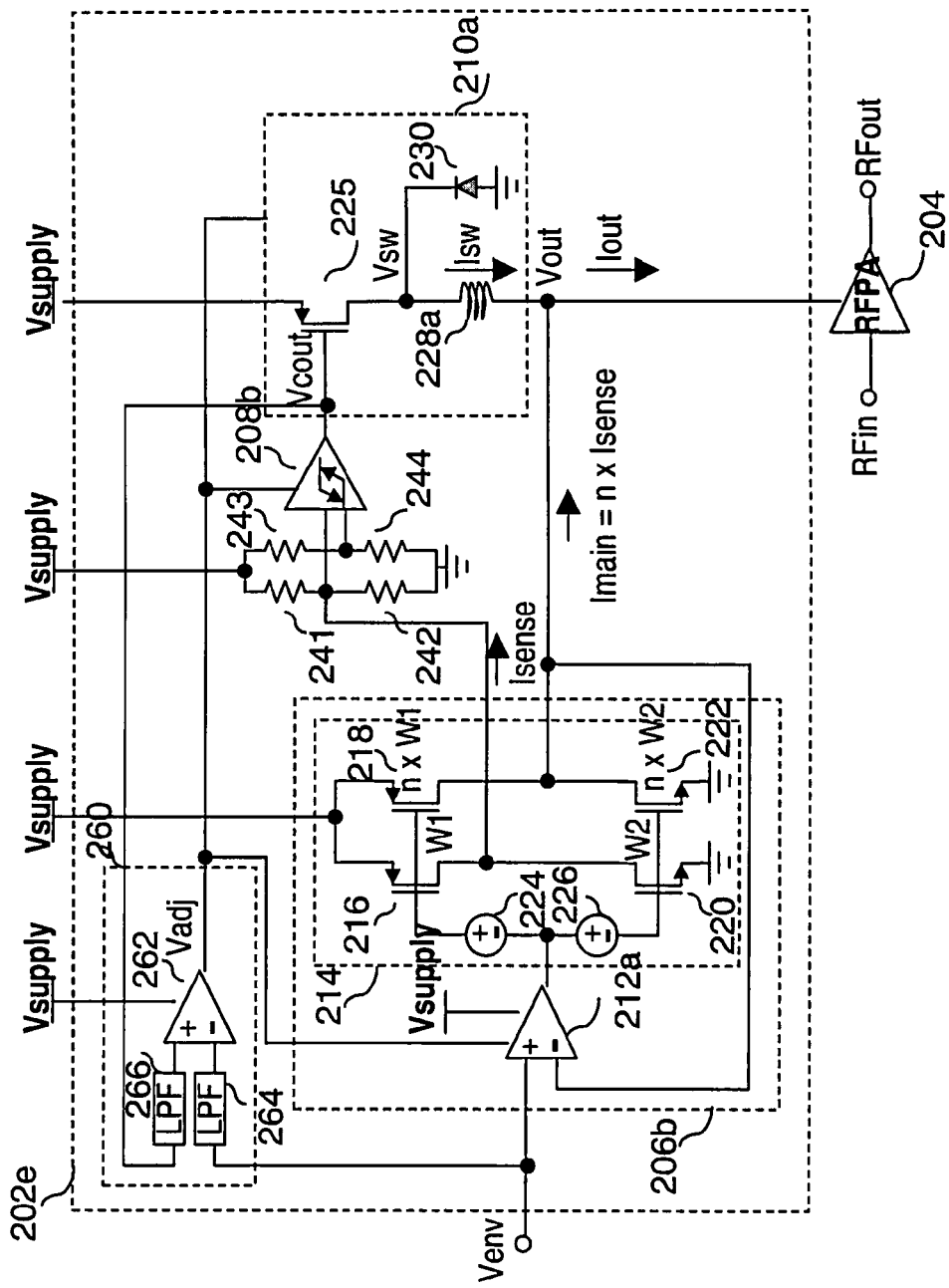
FIG. 10 is a circuit diagram of an envelope amplifier according to Example 5 of the present disclosure.

FIG. 10 depicts a circuit diagram of an envelope amplifier of Example 5 of the present disclosure. In FIG. 10, the same reference numerals as those shown in FIG. 1 depict the same components and hence the corresponding description is dispensed with. In contrast to the envelope amplifier 202a in FIG. 1, an envelope amplifier 202e in FIG. 10 includes a control circuit 260. In addition, the envelope amplifier 202e includes, in place of the linear amplifier 206, comparator 208a and the switching amplifier 210, a linear amplifier 206b, a comparator 208b and a switching amplifier 210a, respectively. The control circuit 260 includes an operation circuit 262 and low-pass filters 264, 266.

The low-pass filter 264 receives the input signal Venv of the envelope amplifier 202e to remove high frequency components to derive a DC voltage which is output to the operation circuit 262. The low-pass filter 266 receives the output Vcout of the comparator 208a to remove high frequency components to derive a DC voltage which is output to the operation circuit 262. The operation circuit 262 receives these two DC voltages to find a difference therebetween to deliver an output voltage Vadj to control terminals of the linear amplifier 206b, comparator 208b and the switching amplifier 210a.

Figure 11:
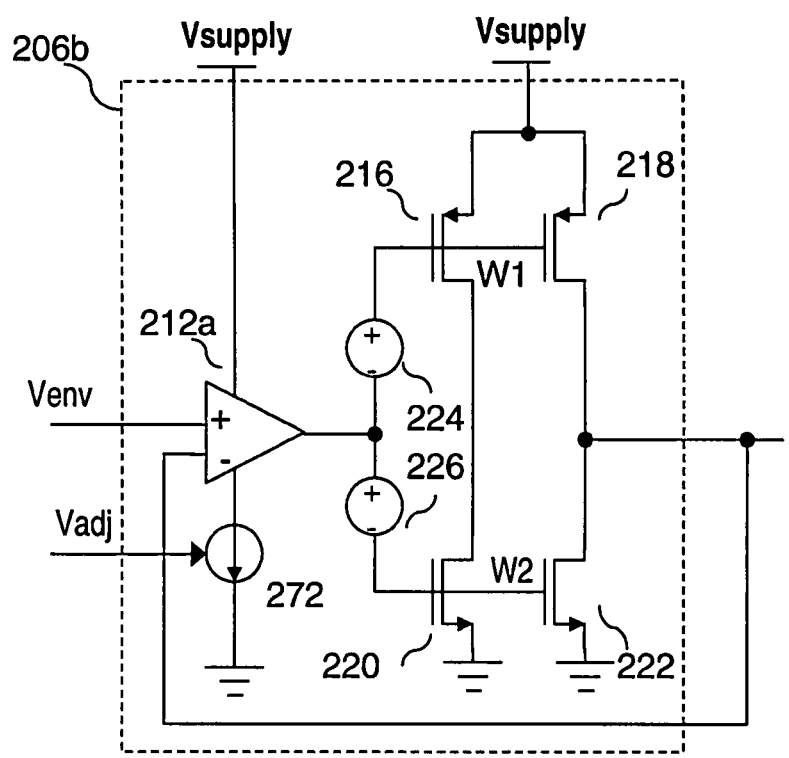
FIG. 11 is a circuit diagram showing an example circuit of a linear amplifier according to Example 5.

FIG. 11 depicts a circuit diagram of the linear amplifier 206b. In contrast to the linear amplifier 206 in FIG. 1, the linear amplifier 206b includes a differential circuit 212a in place of the differential circuit 212. The differential circuit 212a has a power supply terminal connected to Vsupply, while having a GND terminal grounded via a constant current source 272. The constant current source 272 has a function of current adjustment based on the output voltage Vadj of the operation circuit 262.

Figure 12:
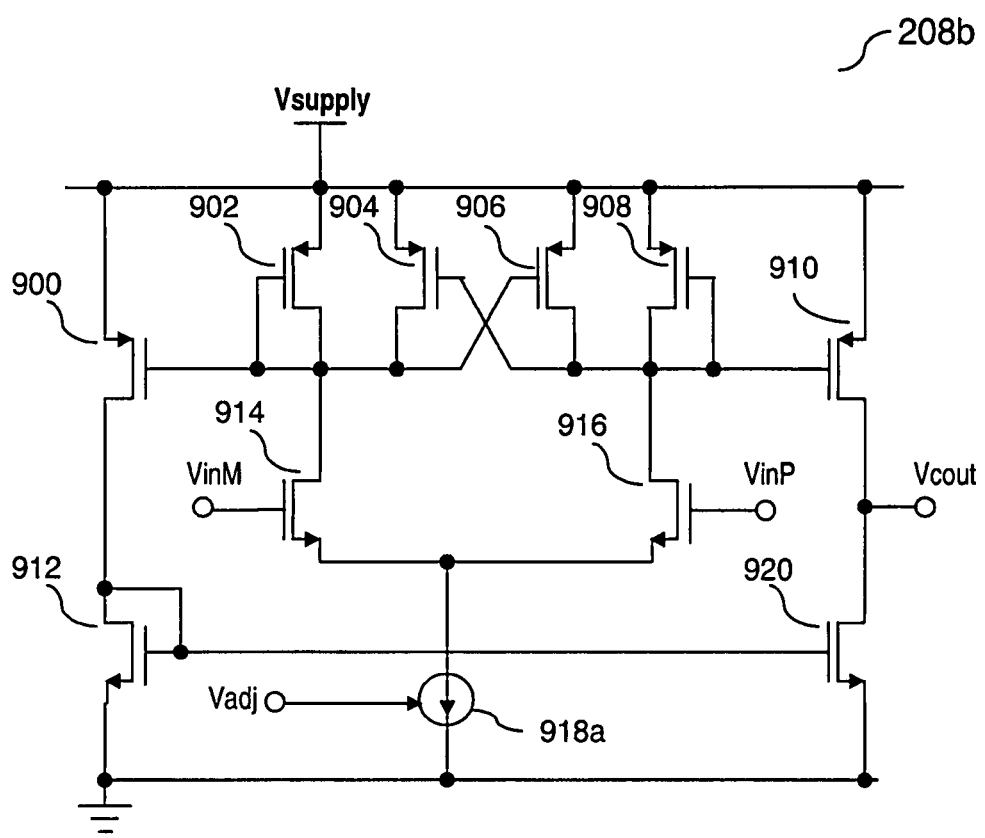
FIG. 12 is a circuit diagram showing an example circuit of a comparator according to Example 5.

FIG. 12 depicts a circuit diagram of an example circuit of the comparator 208b. In FIG. 12, the reference numerals which are the same as those shown in FIG. 2 depict the same components and hence the corresponding description is dispensed with. The comparator 208b includes a constant current source 918a in place of the constant current source 918 in the comparator 208a in FIG. 2. The constant current source 918a has the function of current adjustment based on the output voltage Vadj.

Figure 13:
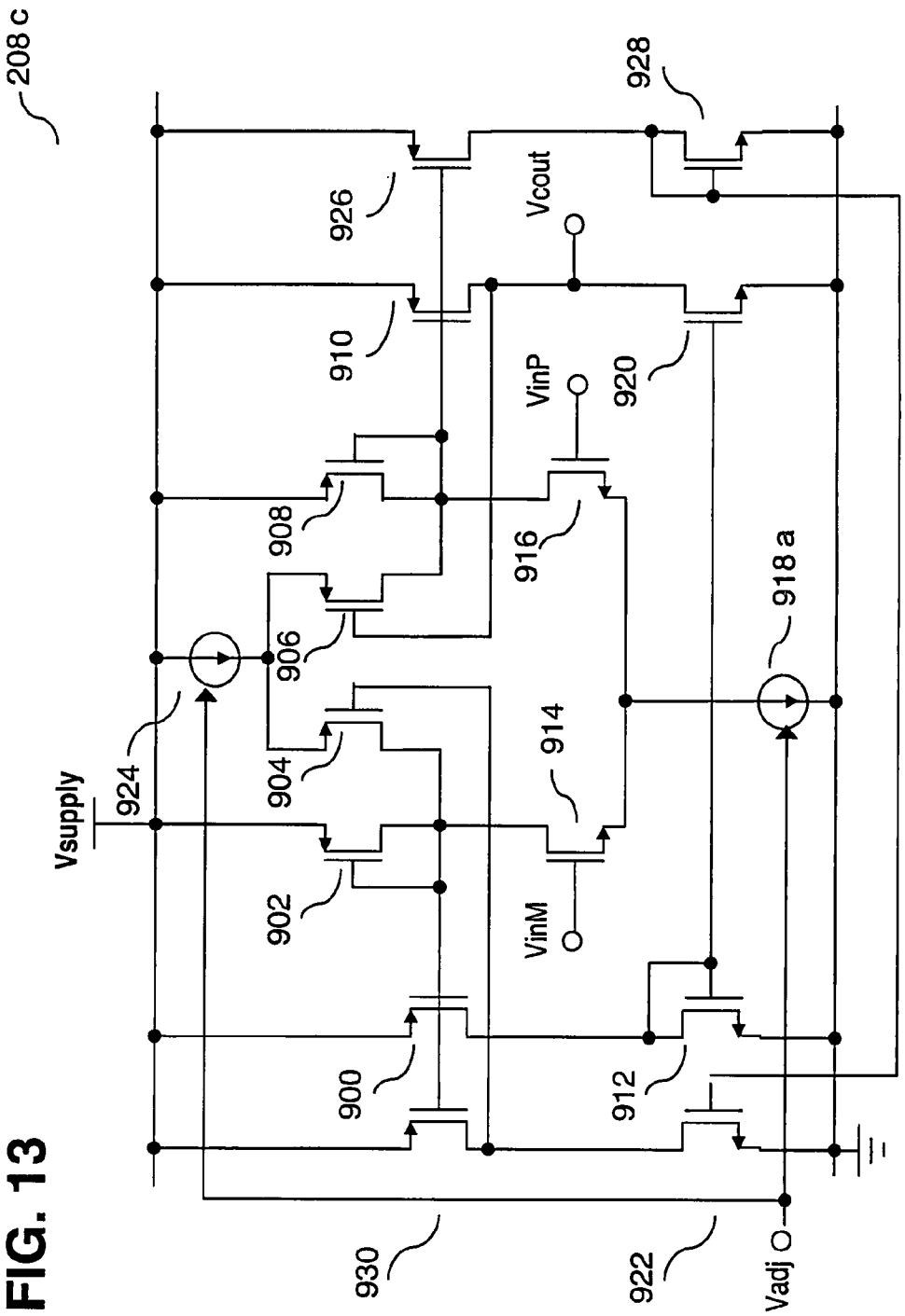
FIG. 13 is a circuit diagram showing another variant circuit of the comparator according to Example 5.

FIG. 13 depicts a circuit diagram of another example circuit of the comparator 208c. In FIG. 13, the reference numerals which are the same as those shown in FIG. 12 depict the same components and hence the corresponding description is dispensed with. The comparator 208c includes, in addition to the components of the comparator 208b in FIG. 12, PMOS transistors 926, 930, NMOS transistors 922, 928 and a constant current source 924 having the function of current adjustment by the voltage Vadj.

The PMOS transistor 926 has a source connected to the power supply Vsupply, while having a gate connected to a drain of the NMOS transistor 916 and having a drain connected to the drain of the NMOS transistor 928 and to the gate of the NMOS transistor 922. The NMOS transistor 928 is diode-connected and has a source grounded. The PMOS transistor 930 has a source connected to the power supply Vsupply, while having a gate connected to the drain of the NMOS transistor 914 and a having drain connected to the drain of the NMOS transistor 922. The NMOS transistor 922 has a source grounded. In distinction from the PMOS transistor 904 in FIG. 12, the PMOS transistor 904 of the present Example has a gate connected to the drain of the PMOS transistor 930, while having a source connected, together with the source of the PMOS transistor 906, via the constant current source 924 to the power supply Vsupply. In distinction from the PMOS transistor 906 in FIG. 12, the PMOS transistor 906 of the present Example has a gate connected to the drain of the PMOS transistor 910.

In the comparator 208c, arranged and constructed as described above, the current values of the constant current sources 918a, 924 are controlled by the output voltage Vadj to adjust the hysteresis width and delay.

Moreover, to impart hysteresis to the circuit, the PMOS transistors 904, 906 are connected so as to form a current mirror with the PMOS transistors 902, 908, respectively, for the current values of the PMOS transistors 902, 908 that are turned on/off in dependence upon the potentials of VinM and VinP, respectively. For example, when VinM is HIGH and VinP is LOW, the PMOS transistor 902 is turned on, so that a gate potential of the PMOS transistor 906 becomes such a value that causes the PMOS transistor 906 to be turned on. If, from this state, VinP is turned on H, the drain potential of the NMOS transistor 916 is determined by an on-resistance of the PMOS transistor 906, an on-resistance of the PMOS transistor 908 and an on-resistance of the NMOS transistor 916. It is noted that the on-resistance of the PMOS transistor 906 is a resistance for the value of the current flowing through the PMOS transistor 902 when VinM is HIGH.

It is then supposed that VinP is turned off next. This time, the drain potential of the NMOS transistor 916 is determined by the on-resistance of the PMOS transistor 908 and the on-resistance of the NMOS transistor 916. This difference provides the hysteresis width.

Thus, by increasing the sizes of the PMOS transistors 904, 906 in comparison with those of the PMOS transistors 902, 908, it is possible to adjust the current values (on-resistances) and hence the hysteresis width. However, if the transistor sizes are excessively enlarged, the response speed of the circuit in its entirety is retarded due to capacitances across the gates, drains and sources of the PMOS transistors 904, 906. Thus, in order to make the hysteresis width adjustable and to not decrease the response speed, it becomes necessary to enlarge changes in the gate potentials of the PMOS transistors 904, 906, for instance such as by changing the gate potential by VDD/GND, thus to decrease their on-resistances.

Based on the above concept, in addition to the circuit configuration in FIG. 12, the PMOS transistor 930, NMOS transistor 922; PMOS transistor 926 and the PMOS transistor 928 are arranged in FIG. 13 symmetrically to the PMOS transistor 910, NMOS transistor 920, PMOS transistor 900 and the PMOS transistor 912, respectively. Thereby an inverted version of Vcout is generated at a junction point between the drain terminals of the PMOS transistor 930 and the NMOS transistor 922. The voltage Vcout and its inverted version are varied between HIGH and LOW (VDD and GND) in response to the potentials VinP and VinM. These potentials may thus be used to control the gate potentials of the PMOS transistors 904, 906.

For example, if the gate potential of the PMOS transistor 906 is 0V, and the on-resistance of the PMOS transistor 906 is sufficiently low, it is the on-resistances of the PMOS transistor 908 and the NMOS transistor 916, and the current value of the constant current source 924, that determine the drain potential of the NMOS transistor 916. It is thus possible to adjust the hysteresis width of the entire circuit by varying the current value of the constant current source 924.

Figure 14:
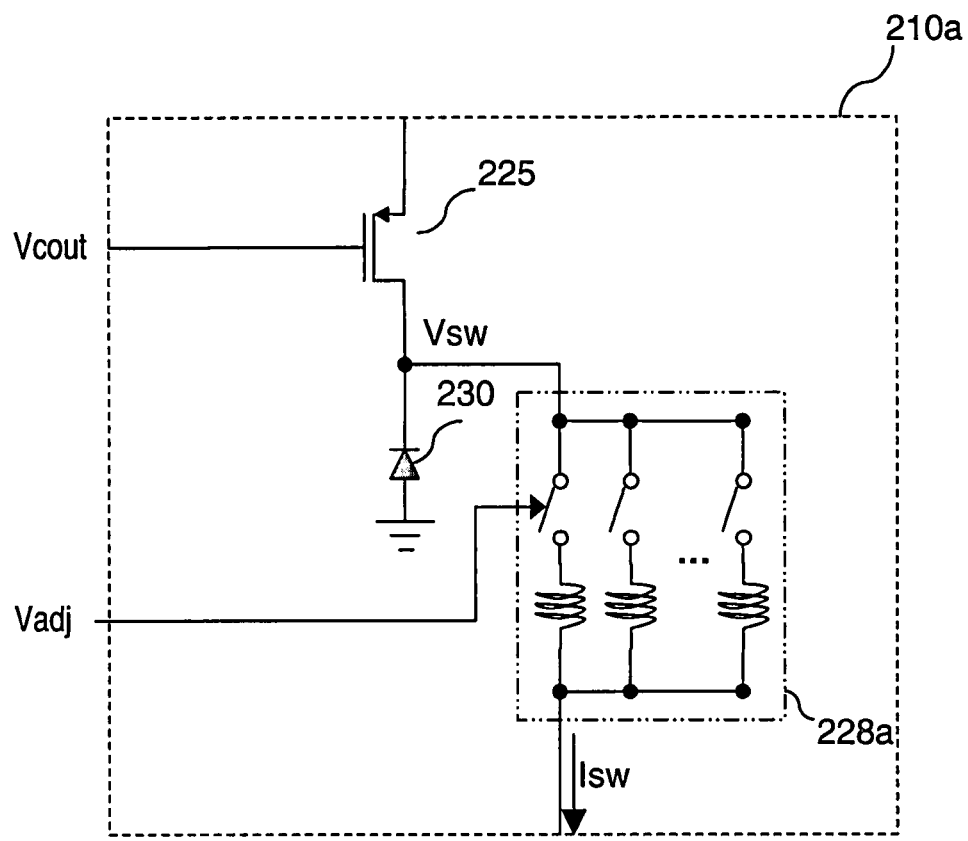
FIG. 14 is a circuit diagram showing an example circuit of a switching amplifier according to Example 5.

FIG. 14 depicts a circuit diagram of an example circuit of the switching amplifier 210a. In FIG. 14, the reference numerals which are the same as those shown in FIG. 1 depict the same components and hence the corresponding description is dispensed with. The switching amplifier 210a includes, in place of the inductor 228 in the switching amplifier 210 in FIG. 1, an inductor circuit 228a that allows for selection of inductance values based on the output voltage Vadj of the operation circuit 262. The inductor circuit 228a may be configured as selectively connecting a plurality of the inductors based on the use of a digital signal correlated with the voltage Vadj.

The envelope amplifier 202e in FIG. 10 operates as follows: The output voltage Vcout of the comparator 208b is an H/L digital signal. The duty of the output voltage Vcout of the comparator 208b is controlled to compensate for voltage drop ascribable to the on-resistance of the switching MOS transistor 225. It is because negative feedback is applied to an internal circuit comprised of the comparator 208b, switching amplifier 210a and the linear amplifier 206b. Hence, the duty of the output voltage of the comparator 208b is determined by the ratio of the on-resistance of the switching MOS transistor 225 and the impedance Rload of the amplifier 204 looking from the envelope amplifier 202e. In short, the voltage drop Vdrop by the on-resistance of the switching MOS transistor 225 may be obtained by subtracting an averaged value of the input signal Venv from an averaged value Vcouta of the output voltage Vcout of the comparator 208b. With the on-resistance Ron of the switching MOS transistor 225, Vdrop may be represented by the following equation:

$$V\text{drop}=V\text{couta}*Ron/(R\text{load}+Ron).$$

It is seen from the above equation that Vdrop decreases with increase in the value of Rload and increases with decrease of Rload. The output voltage Vcout of the comparator 208b is averaged by the low-pass filter 266, while the input signal Venv is averaged by the low-pass filter 264. The operation circuit 262 finds a difference between the two averaged signals to amplify it to yield the output voltage Vadj. This output voltage Vadj in turn controls the current consumption and the gain of the linear amplifier 206b as well as the current consumption, hysteresis voltage width and delay of the comparator 208b and the inductance of the inductor circuit 228a in the switching amplifier 210a.

Figure 15:
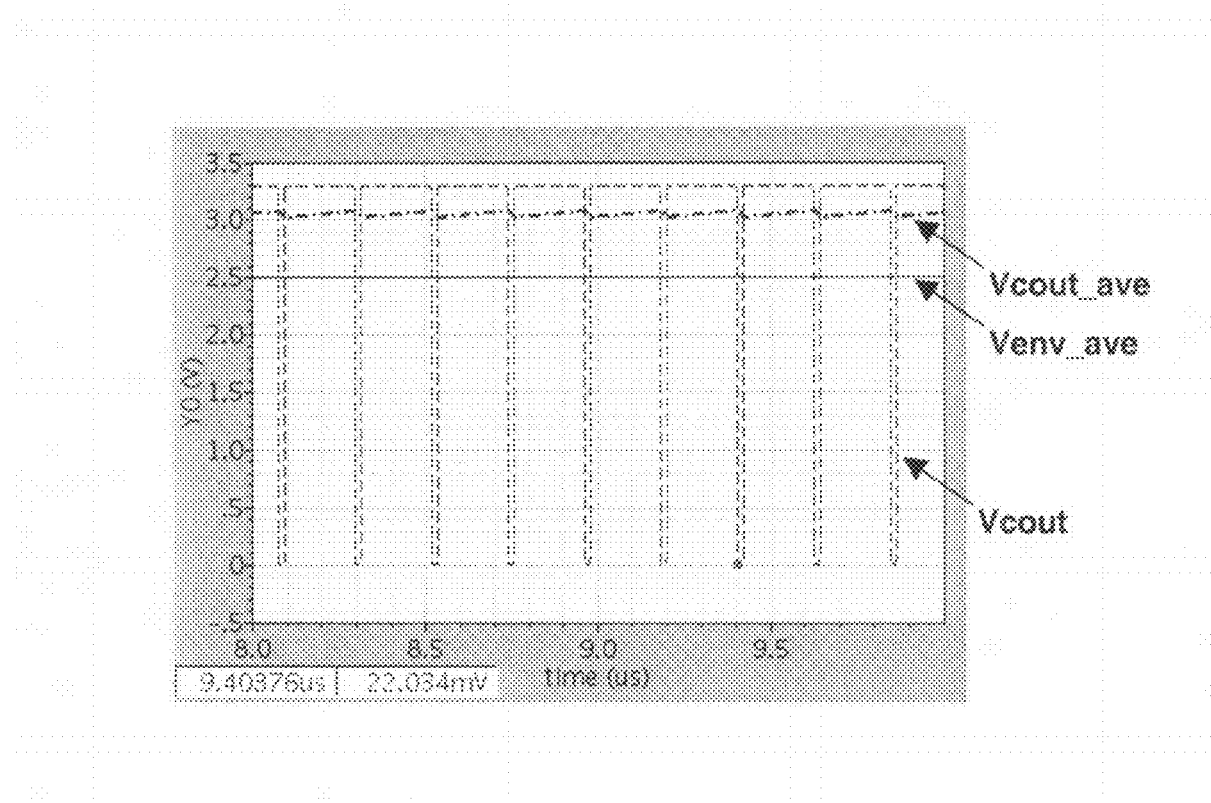
FIG. 15 is a timing chart (1) for various portions of the envelope amplifier according to Example 5.
Figure 16:
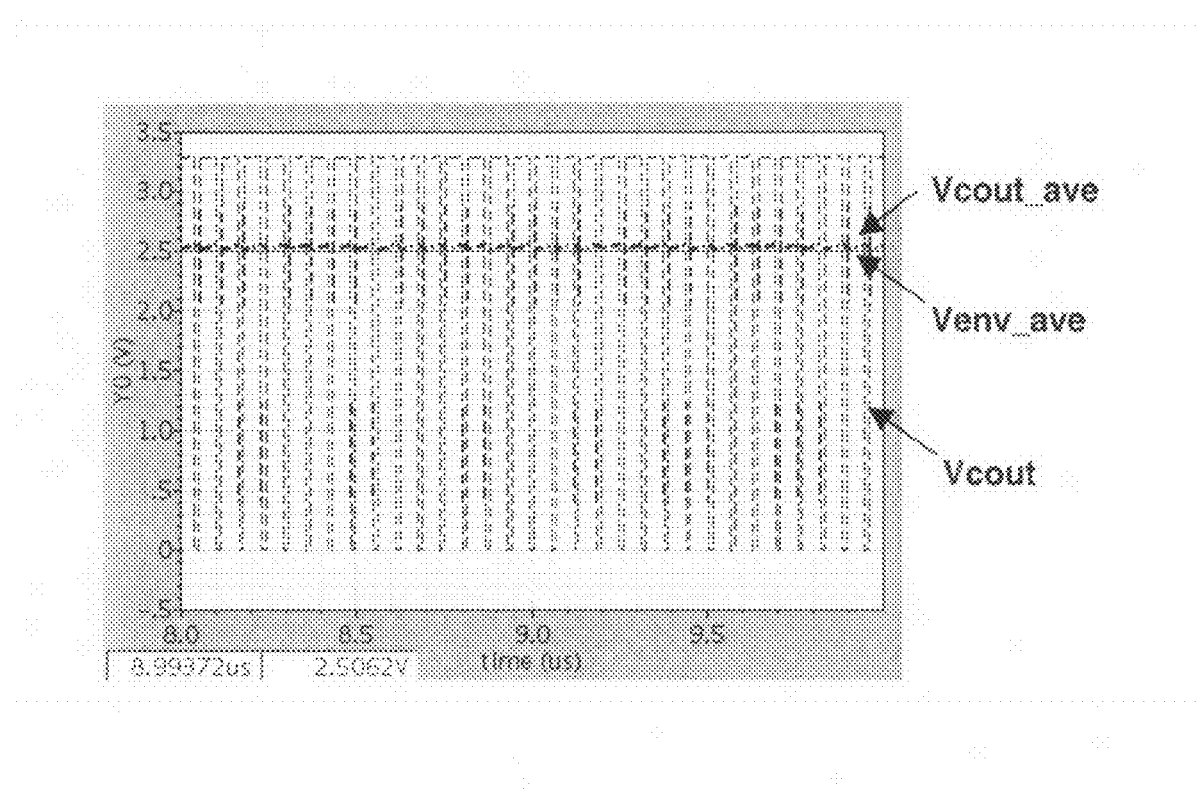
FIG. 16 is a timing chart (2) for various portions of the envelope amplifier according to Example 5.
Figure 17A:
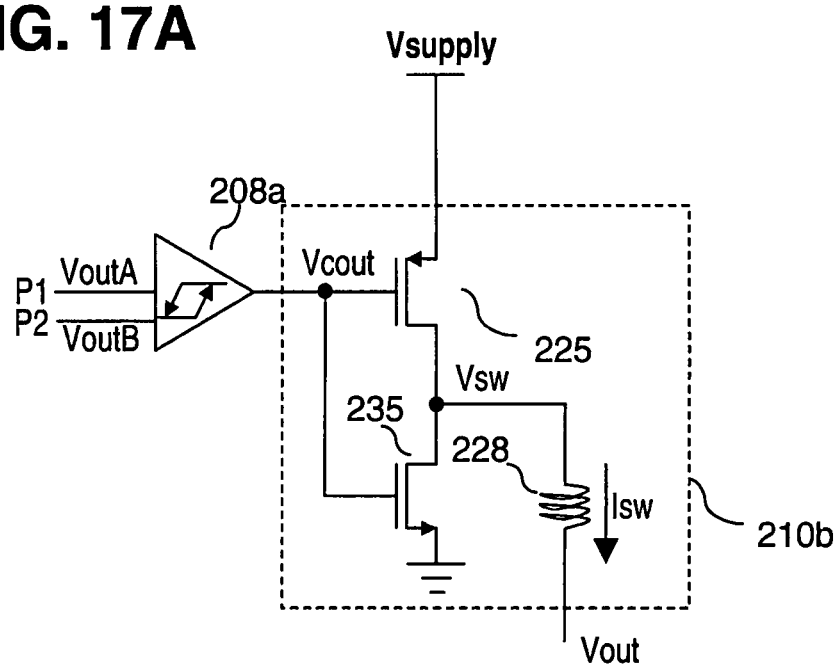
FIGS. 17A and 17B are circuit diagrams showing modifications of a switching amplifier according to the present disclosure.
Figure 17B:
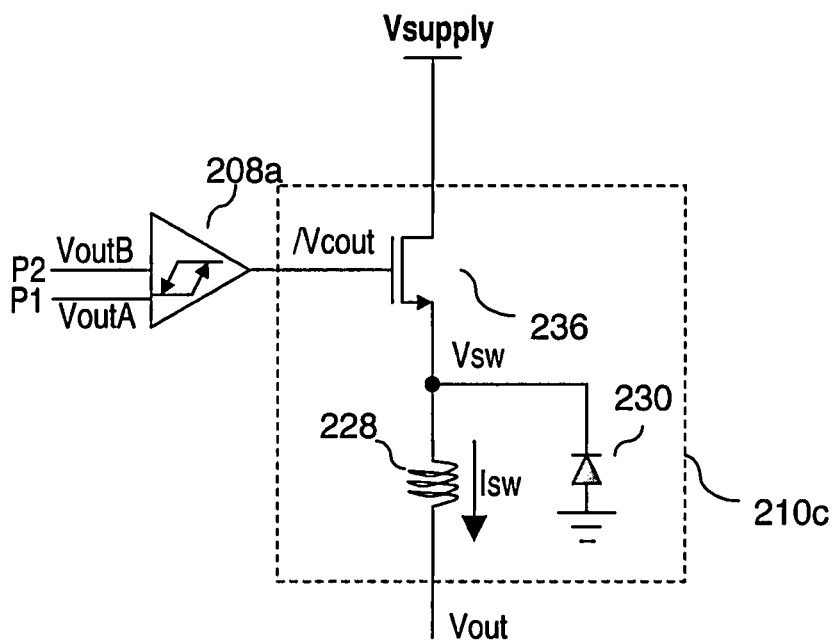

As examples of the results of the above simulation, FIG. 15 shows a waveform of Vcout, the waveform of Vcout_ave, as an output of the low-pass filter 266, and the waveform of Venv_ave, as an output of the low-pass filter 264, for an input signal of 2.5VDC, with Rload=50 ohm. FIG. 16 shows another waveform of Vcout, the waveform of Vcout_ave, as an output of the low-pass filter 266 and the waveform of Venv_ave, as an output of the low-pass filter 264, for the input signal of 2.5VDC, with Rload=50 ohm.

It may be seen that, if Rload is small, the current Iout increases, so that the voltage drop in the switching MOS transistor 225 increases, and that, to compensate for this, the duty of the HIGH level of the output voltage Vcout of the comparator 208*b* increases, with the output voltage Vcout_ave of the low-pass filter 266 then increasing.

For example, if the impedance Rload of the amplifier 204 looking from the output terminal Vout of the envelope amplifier 202*e* increases, the voltage drop Vdrop caused by the on-resistance of the switching MOS transistor 225 decreases. This causes the output voltage of the operation circuit 262 to be changed in a manner of controlling the linear amplifier 206*b*, comparator 208*b* and the inductor circuit 228*a*.

Given the above equation Vout_ripple=Isw_ripple·(Zout‖RLoad), if, in connection with the linear amplifier 206*b*, the output impedance Zout increases with increase in Rload, such increase in the output impedance does not matter. It is thus possible to lower the gain to decrease the operating current. Thus, if increase in Zout is suppressed to, such an extent that a parameter (Zout‖RLoad) after increase of RLoad will be small as compared to a parameter (Zout‖RLoad) before RLoad increase, increase in Isw_ripple does not matter. It is thus possible to lower the internal oscillation frequency of the inner loop made up of the linear amplifier 206*b*, comparator 208*b* and the switching amplifier 210*a*. To lower the internal oscillation frequency, it is sufficient to increase the hysteresis voltage of the comparator 208*b* or the inductance of the inductor circuit 228*a*. The hysteresis voltage of the comparator 208*b* or the inductance of the inductor circuit 228*a* may be optimized by adjusting the amplitude or the frequency of the input signal Venv of the envelope amplifier 202*e*.

If the internal oscillation frequency is lowered in this manner, the delay in the comparator 208*b* may be increased, so that it is possible to reduce the operating current of the comparator 208*b* as well as the switching loss of the switching MOS transistor 225.

The envelope amplifier 202*e* operates as described above. By using the output voltage Vcout of the comparator 208*b* and the control circuit 260 that receives the input signal Venv, it is possible to improve the efficiency in case the impedance RLoad of the amplifier 204 looking from the output terminal Vout of the envelope amplifier 202*e* is increased. It is also possible to suppress variations in the internal oscillation frequency ascribable to RLoad variations.

The switching amplifier 210 (210*a*) in FIGS. 1, 5, 6, 7, 10 and 14 is made up of the switching MOS transistor 225, diode 230 and the inductor 228 (inductor circuit 228*a*). However, the switching MOS transistor 225 and the diode 230 may be replaced by alternative components performing comparable operations. For example, in a switching amplifier 210*b* shown in FIG. 17A, the diode 230 may be replaced by an n-type switching MOS transistor 235, the gate of which is connected common to the gate of the switching MOS transistor 225 for operation as a class D amplifier. Also, in a switching amplifier 210*c*, shown in FIG. 17B, the p-type switching MOS transistor 225 may be replaced by an n-type switching MOS transistor 236, the drain of which is connected to Vsupply and the source of which is connected to the inductor 228. Both input ends of the comparator 208A are also interchanged. Viz., the switching MOS transistor 236 may be driven by an output signal (/Vcout) which is in an inversed phase with respect to a signal used for the comparator 208*a* to drive the switching MOS transistor 225.

The disclosure of the aforementioned Patent Publications is incorporated herein by reference thereto. The particular modes or examples may be modified or adjusted within the range of the entire disclosure of the present disclosure, inclusive of claims, based on the fundamental technical concept of the disclosure. In addition, various combinations or selection of elements disclosed herein may be made within the framework of the claims. Viz., the present disclosure may encompass various changes or corrections that may occur to those skilled in the art in accordance with and within the gamut of the entire disclosure, inclusive of claims and the technical concept of the present disclosure. It should be noted that other objects, features and aspects of the present disclosure will become apparent in the entire disclosure and that modifications may be done without departing the gist and scope of the present disclosure as disclosed herein and claimed as appended herewith.

What is claimed is:

1. An envelope amplifier comprising:
an amplifier unit including a first output section that outputs a first current in response to an amplitude of an input envelope signal and a second output section that outputs a second current of a current value proportionate to the a current value of said first current, the absolute value of said current value of said second current being greater than that of said current value of said first current;
a comparator unit that includes:
a first input terminal receiving a voltage subjected to said first current;
a second input terminal receiving a preset bias voltage; and
a resistance element connected between said first and second input terminals,
wherein said comparator unit compares said voltage subjected to said first current with said preset bias voltage and outputs a compared result; and
an output unit that sums a current derived via an inductor which is regulated in response to the compared result of said comparator unit, to said second current to deliver a resulting sum current at an output end, said first current being configured to be terminated in said comparator unit without being delivered to said output unit.

2. The envelope amplifier according to claim 1, wherein said comparator unit outputs, as said compared result, whether the current value of said first current has exceeded a preset threshold value in one direction or has fallen short of the other preset threshold value in an opposite direction.

3. The envelope amplifier according to claim, wherein said resistance element is defined as a first resistance element, said comparator unit further includes:
a second resistance element connected between a first power supply and said second input terminal; and
a third resistance element connected between a second power supply and said second input terminal.

4. An envelope amplifier comprising:
an amplifier unit including a first output section that outputs a first current in response to an amplitude of an input envelope signal and a second output section that outputs a second current of a current value proportionate to a current value of said first current, the absolute value of said current value of said second current being greater than that of said current value of said first current;
a comparator unit that includes:

a first input terminal receiving a voltage subjected to said first current;
a second input terminal receiving a reference voltage;
a first resistance element connected between a first power supply and said first input terminal;
a second resistance element connected between a second power supply and said first input terminal;
a third resistance element connected between said first power supply and said second input terminal; and
a fourth resistance element connected between said second power supply and said second input terminal,
wherein said comparator unit compares said voltage subjected to said first current with said reference voltage and outputs a compared result; and
an output unit that sums a current derived via an inductor which is regulated in response to the compared result of said comparator unit, to said second current to deliver a resulting sum current at an output end, said first current being configured to be terminated in said comparator unit without being delivered to said output unit.

5. An envelope amplifier comprising:
an amplifier unit including a first output section that outputs a first current in response to an amplitude of an input envelope signal and a second output section that outputs a second current of a current value proportionate to a current value of said first current, the absolute value of said current value of said second current being greater than that of said current value of said first current;
a comparator unit that includes first and second input terminals that receive two voltages to be compared to each other and outputs a compared result that is whether the current value of said first current has exceeded a first preset threshold value in one direction or has fallen short of a second preset threshold value in an opposite direction;
a first termination circuit having one end connected to said first input terminal;
a second termination circuit having one end connected to said second input terminal; and
an output unit that sums a current via an inductor derived via an inductor which is regulated in response to the compared result of said comparator unit, to said second current to deliver a resulting sum current at an output end, said first current being configured to be terminated in said comparator unit without being delivered to said output unit,
wherein said first current for one direction being supplied to said first input terminal and said first current for an opposite direction being supplied to said second input terminal.

6. The envelope amplifier according to claim 5, wherein each of said first and second termination circuits comprises a series circuit of a resistor element and a diode.

7. An envelope amplifier comprising:
an amplifier unit that outputs an output current in response to an amplitude of an input envelope signal;
a comparator unit that compares a current value of said output current;
an output unit that sums a current via an inductor derived from a current, which is regulated in response to a compared result of said comparator unit, to said output current to deliver the resulting sum current at an output end thereof; and
an operation unit that finds a difference between a low frequency component in said envelope signal and a low frequency component in a signal that has been turned into a binary signal in response to said compared result of said comparator unit,
said operation unit controlling an input/ output characteristic in at least one out of said amplifier unit, said comparator unit, and said output unit in response to said difference as found.

8. The envelope amplifier according to claim 7, wherein said amplifier unit controls a current value of a power supply current in said amplifier unit in response to said difference as found.

9. The envelope amplifier according to claim 7, wherein said comparator unit controls a current value of a power supply current in said comparator unit in response to said difference as found.

10. The envelope amplifier according to claim 7, wherein said output unit controls inductance of said inductor in response to said difference as found.

11. The envelope amplifier according to claim 7, wherein said amplifier unit outputs, as said output current, a first current and a second current,
said second current being of a current value proportionate to a current value of said first current,
an absolute value of said second current being greater than that of said first current,
said comparator unit comparing the current value of said first current,
said output unit summing a current via an inductor derived from a current, which is sustained or broken in response to said compared result of said comparator unit, to said second current to output a resulting sum current at an output end, and
said first current being configured to be terminated without being delivered to said output unit.

12. The envelope amplifier according to claim 7, wherein said first current is terminated in said comparator unit.

13. The envelope amplifier according to claim 7, wherein said comparator unit outputs, as said compared result, whether the current value of said first current has exceeded a preset threshold value in one direction or has fallen short of the other preset threshold value in an opposite direction.

14. The envelope amplifier according to claim 7, wherein said comparator unit includes:
first and second input terminals that receive two voltages to be compared to each other; and
a resistance element connected between said first and second input terminals,
wherein said first current is supplied to said first input terminal and a preset bias voltage is applied to said second input terminal.

15. The envelope amplifier according to claim 7, wherein said comparator unit includes:
first and second input terminals that receive two voltages compared to each other;
a first resistance element connected between said first and second input terminals;
a second resistance element connected between a first power supply and said second input terminal; and
a third resistance element connected between a second power supply and said second input terminal, said first current being delivered to said first input terminal.

16. The envelope amplifier according to claim 7, wherein said comparator unit includes:
first and second input terminals that receive two voltages to be compared to each other;
a first resistance element connected between a first power supply and said first input terminal;

a second resistance element connected between a second power supply and said first input terminal;

a third resistance element connected between said first power supply and said second input terminal; and a fourth resistance element connected between said second power supply and said second input terminal, said first current being supplied to said first input terminal.

17. The envelope amplifier according to claim 7, wherein said comparator unit includes:

first and second input terminals that receive two voltages to be compared to each other;

a first termination circuit having one end connected to said input terminal; and a second termination circuit having one end connected to said second input terminal, said first current for one direction being supplied to said first input terminal and said first current for an opposite direction being supplied to said second input terminal.

18. The envelope amplifier according to claim 17, wherein each of said first and second termination circuit comprises a series circuit of a resistance element and a diode.

\* \* \* \* \*

UNITED STATES PATENT AND TRADEMARK OFFICE
CERTIFICATE OF CORRECTION

PATENT NO. : 8,508,297 B2
APPLICATION NO. : 13/137203
DATED : August 13, 2013
INVENTOR(S) : Yuri Honda et al.

Page 1 of 1

It is certified that error appears in the above-identified patent and that said Letters Patent is hereby corrected as shown below:

In the Claims

Column 18 line 52 claim 3, replace "The envelope amplifier according to claim, wherein said" with
-- The envelope amplifier according to claim 1, wherein said --

Signed and Sealed this
Twenty-ninth Day of October, 2013

Teresa Stanek Rea
*Deputy Director of the United States Patent and Trademark Office*